(12) United States Patent
Lee et al.

(10) Patent No.: US 12,354,960 B2
(45) Date of Patent: Jul. 8, 2025

(54) THREE-DIMENSIONAL SEMICONDUCTOR MEMORY DEVICE INCLUDING SEPARATION STRUCTURES AND SACRIFICIAL LAYERS AND ELECTRONIC SYSTEM INCLUDING THE SAME

(71) Applicant: Samsung Electronics Co., Ltd., Suwon-si (KR)

(72) Inventors: Haemin Lee, Seoul (KR); Byoung-Taek Kim, Seongnam-si (KR); Hyeonjoo Song, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 330 days.

(21) Appl. No.: 17/739,583

(22) Filed: May 9, 2022

(65) Prior Publication Data

US 2023/0058328 A1     Feb. 23, 2023

(30) Foreign Application Priority Data

Aug. 23, 2021   (KR) .................. 10-2021-0110901

(51) Int. Cl.
*H10B 43/27*      (2023.01)
*H01L 23/535*     (2006.01)
(Continued)

(52) U.S. Cl.
CPC .......... *H01L 23/535* (2013.01); *H10B 43/27* (2023.02); *H10B 43/40* (2023.02); *H10D 88/00* (2025.01)

(58) Field of Classification Search
CPC ....... H01L 23/535; H10B 41/10; H10B 41/20; H10B 41/50; H10B 43/10; H10B 43/20; H10B 43/27; H10B 43/40; H10B 43/50
See application file for complete search history.

(56) References Cited

U.S. PATENT DOCUMENTS 9,230,987 B2   1/2016  Pachamuthu et al.
10,229,927 B2  3/2019  Lee et al.
(Continued)

FOREIGN PATENT DOCUMENTS

CN      112420713 A  *  2/2021  ......... G11C 16/0483
KR      2016/003977 A   1/2016
KR      2021/0058562 A  5/2021

*Primary Examiner* — Ida M Soward
(74) *Attorney, Agent, or Firm* — HARNESS, DICKEY & PIERCE, P.L.C.

(57) ABSTRACT

Disclosed are three-dimensional (3D) semiconductor memory devices and electronic system including the same. The 3D semiconductor memory device may include a substrate including first and second regions, a stack structure including interlayer dielectric layers and gate electrodes alternately and repeatedly stacked on the substrate and having a stepwise structure on the second region, a mold structure adjacent to the stack structure on the first region and including interlayer dielectric layers and sacrificial layers alternately and repeatedly stacked on the substrate, a first separation structure crossing the stack structure and extending along a first direction from the first region toward the second region, and a second separation structure crossing the mold structure and extending in the first direction on the first region. A level of a top surface of the first separation structure may be higher than a level of a top surface of the second separation structure.

20 Claims, 19 Drawing Sheets

(51) Int. Cl.
*H10B 43/40* (2023.01)
*H10D 88/00* (2025.01)

(56) References Cited

U.S. PATENT DOCUMENTS

| | | |
|---|---|---|
| 10,840,260 B2 | 11/2020 | Kai et al. |
| 10,861,871 B2 | 12/2020 | Tobioka |
| 10,872,857 B1 | 12/2020 | Otsu et al. |
| 10,923,491 B2 | 2/2021 | Lu et al. |
| 11,552,099 B2 | 1/2023 | Kim et al. |
| 11,812,617 B2 * | 11/2023 | Takaki .............. H10B 41/27 |
| 11,889,700 B2 * | 1/2024 | Lee .............. H10B 41/41 |
| 11,963,362 B2 * | 4/2024 | Jeong .............. H10B 43/27 |
| 12,082,418 B2 * | 9/2024 | Uchida .............. H10B 43/40 |
| 12,101,937 B2 * | 9/2024 | Jeong .............. H10B 43/10 |
| 12,120,882 B2 * | 10/2024 | Chun .............. H10B 41/35 |
| 2017/0179153 A1 * | 6/2017 | Ogawa .............. H01L 23/5283 |
| 2019/0319038 A1 * | 10/2019 | Zhang .............. H01L 23/535 |
| 2020/0043830 A1 * | 2/2020 | Baek .............. H10B 43/40 |
| 2021/0036014 A1 * | 2/2021 | Yang .............. H10B 43/10 |
| 2021/0066313 A1 | 3/2021 | Park et al. |
| 2021/0126002 A1 | 4/2021 | Zhu et al. |
| 2021/0320125 A1 | 10/2021 | Shin et al. |

\* cited by examiner

THREE-DIMENSIONAL SEMICONDUCTOR MEMORY DEVICE INCLUDING SEPARATION STRUCTURES AND SACRIFICIAL LAYERS AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2021-0110901 filed on Aug. 23, 2021 in the Korean Intellectual Property Office, the disclosure of which is hereby incorporated by reference in its entirety.

BACKGROUND

Inventive concepts relate to a three-dimensional semiconductor memory device and an electronic system including the same, and more particularly, to a nonvolatile three-dimensional semiconductor memory device including a vertical channel structure, a method of fabricating the same, and an electronic system including the same.

A semiconductor device capable of storing a large amount of data may be necessary in an electronic system that stores data. Semiconductor devices have been highly integrated to meet high performance and low manufacturing cost, which are required by customers. Integration of typical two-dimensional or planar semiconductor devices may be primarily determined by the area occupied by a unit memory cell, such that it may be greatly influenced by the level of technology for forming fine patterns. However, extremely expensive processing equipment may be needed to increase pattern fineness and may set a practical limitation on increasing the integration of the two-dimensional or planar semiconductor devices. Therefore, there have been proposals for three-dimensional semiconductor memory devices having three-dimensionally arranged memory cells.

SUMMARY

Some embodiments of inventive concepts provide a three-dimensional semiconductor memory device whose reliability and electric properties are improved and/or a simplified method of fabricating the same.

Some embodiments of inventive concepts provide an electronic system including the three-dimensional semiconductor memory device.

Features, objects, and effects of inventive concepts are not limited to those mentioned above, and other features, objects, and effects that are not mentioned above will be clearly understood by those skilled in the art from the following description.

According to some embodiments of inventive concepts, a three-dimensional semiconductor memory device may include a substrate including a first region and a second region; a stack structure including a plurality of interlayer dielectric layers and a plurality of gate electrodes that are alternately and repeatedly stacked on the substrate, the stack structure having a stepwise structure on the second region; a mold structure adjacent to the stack structure on the first region, the mold structure including a plurality of interlayer dielectric layers and a plurality of sacrificial layers that are alternately and repeatedly stacked on the substrate; a first separation structure crossing the stack structure and extending along a first direction from the first region toward the second region; and a second separation structure crossing the mold structure and extending in the first direction on the first region. A level of a top surface of the first separation structure may be higher than a level of a top surface of the second separation structure.

According to some embodiments of inventive concepts, a three-dimensional semiconductor memory device may include a first substrate including a first region and a second region; a peripheral circuit structure including a plurality of peripheral circuit transistors on the first substrate; a second substrate on the peripheral circuit structure; a stack structure including a plurality of interlayer dielectric layers and a plurality of gate electrodes that are alternately and repeatedly stacked on the second substrate, the stack structure having a stepwise structure on the second region; a plurality of first vertical channel structures penetrating the stack structure, the plurality of first vertical channel structures contacting the second substrate and the plurality of gate electrodes; a first mold structure adjacent to the stack structure on the first region, the first mold structure including a plurality of interlayer dielectric layers and a plurality of sacrificial layers that are alternately and repeatedly stacked on the second substrate; a plurality of second vertical channel structures penetrating the first mold structure, the plurality of second vertical channel structures contacting the second substrate and the plurality of sacrificial layers; a first separation structure crossing the stack structure and extending along a first direction from the first region toward the second region; a second separation structure crossing the first mold structure and extending in the first direction on the first region; a first contact plug penetrating the stepwise structure of the stack structure and connecting electrically with one of the plurality of gate electrodes; a second contact plug penetrating the first mold structure and connecting electrically with one of the plurality of peripheral circuit transistors of the peripheral circuit structure; a plurality of bit lines electrically connected to the plurality of first vertical channel structures; and a plurality of conductive lines electrically connected to the first contact plug and the second contact plug. A level of a top surface of the first separation structure may be higher than a level of a top surface of the second separation structure.

According to some embodiments of inventive concepts, an electric system may include a three-dimensional semiconductor memory device and a controller. The controller may be electrically connected to the three-dimensional semiconductor memory device and configured to control the three-dimensional semiconductor memory device. The three-dimensional semiconductor memory device may include a substrate including a first region and a second region; a stack structure including a plurality of interlayer dielectric layers and a plurality of gate electrodes that are alternately and repeatedly stacked on the substrate, the stack structure having a stepwise structure on the second region; a mold structure adjacent to the stack structure on the first region, the mold structure including a plurality of interlayer dielectric layers and a plurality of sacrificial layers that are alternately and repeatedly stacked on the substrate; a first separation structure crossing the stack structure and extending along a first direction from the first region toward the second region; a second separation structure crossing the mold structure and extending in the first direction on the first region; a plurality of contact plugs penetrating the mold structure; and an input/output pad connected to one of the plurality of contact plugs. The controller may be electrically connected through the input/output pad to the three-dimensional semiconductor memory device. A height in a vertical direction of the first separation structure may be greater than a height in the vertical direction of the second separation structure.

DETAILED DESCRIPTION OF EMBODIMENTS

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

The following will now describe in detail a three-dimensional semiconductor memory device, a method of fabricating the same, and an electronic system including the same according to some embodiments of inventive concepts in conjunction with the accompanying drawings.

Figure 1A:
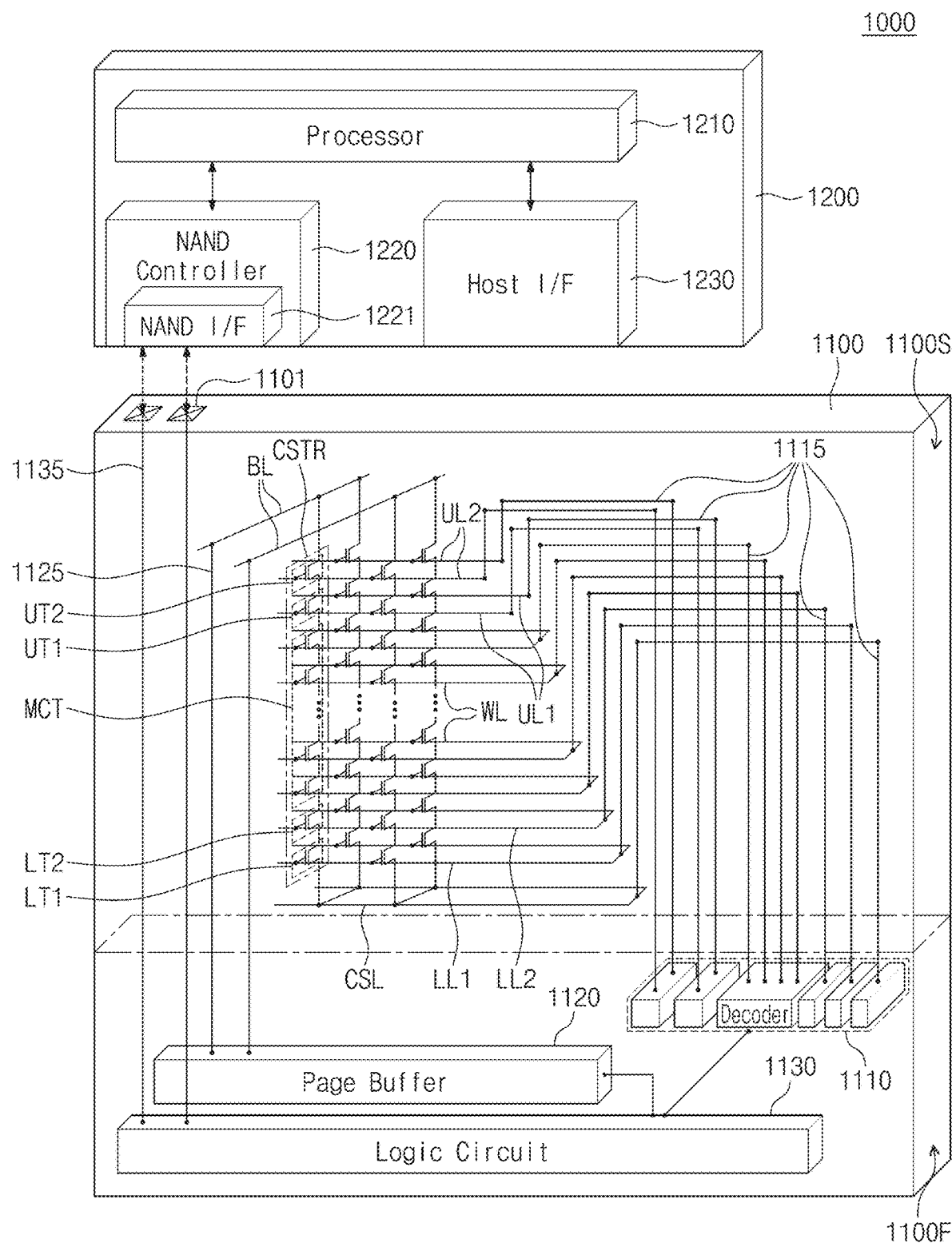
FIGS. 1A and 1B illustrate simplified plan views showing a three-dimensional semiconductor memory device according to some embodiments of inventive concepts.

FIG. 1A illustrates a simplified plan view showing a three-dimensional semiconductor memory device according to some embodiments of inventive concepts.

Referring to FIG. 1A, an electronic system 1000 according to some embodiments of inventive concepts may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic apparatus that includes the storage device. For example, the electronic system 1000 may be a solid state drive (SSD) device, a universal serial bus (USB), a computing system, a medical apparatus, or a communication apparatus each of which includes a single or a plurality of three-dimensional semiconductor memory devices 1100.

The three-dimensional semiconductor memory device 1100 may be a nonvolatile memory device, such as a three-dimensional NAND Flash memory device which will be discussed below. The three-dimensional semiconductor memory device 1100 may include a first region 1100F and a second region 1100S on the first region 1100F. For example, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and memory cell transistors MCT disposed between the first transistors LT1 and LT2 and the second transistors UT1 and UT2. The number of the first transistors LT1 and LT2 and of the second transistors UT1 and UT2 may be variously changed in accordance with embodiments.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erasure control transistor LT1 and a ground selection transistor LT2 that are connected in series. The second transistors UT1 and UT2 may include a string selection transistor UT1 and a second erasure control transistor UT2 that are connected in series. One or both of the first and second erasure control transistors LT1 and UT2 may be employed to perform an erase operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120.

The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control an overall operation of the electronic system 1000 that includes the controller 1200. The processor 1210 may operate based on certain firmware, and may control the NAND controller 1220 to access the three-dimensional semiconductor memory device 1100. The NAND controller 1220 may include NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 1B:
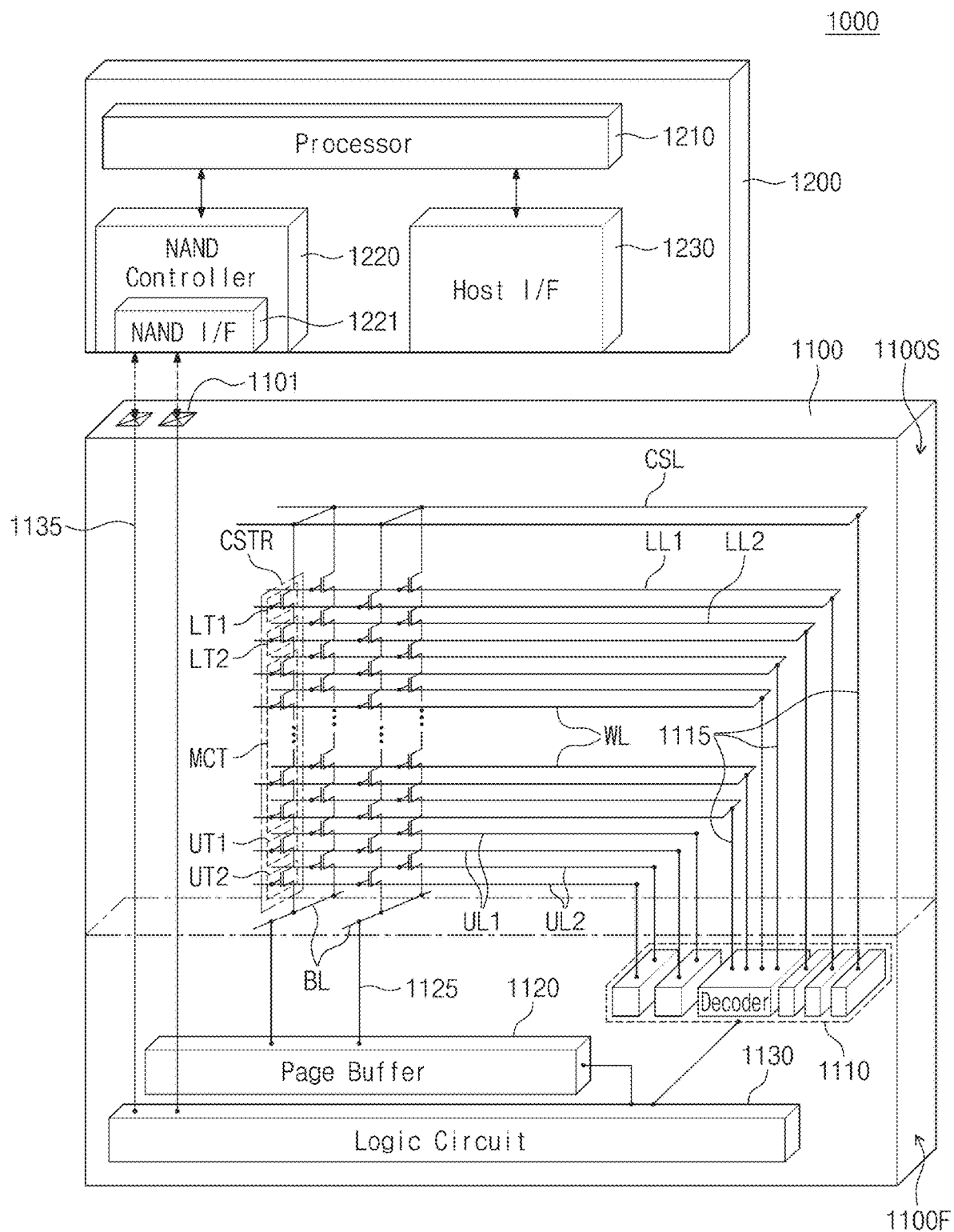

FIG. 1B illustrates a simplified plan view showing a three-dimensional semiconductor memory device according to some embodiments of inventive concepts. For convenience of description below, omission will be made to avoid repetitive explanation of substantially the same components discussed with reference to FIG. 1A, and differences will be described in detail.

Referring to FIG. 1B, on the second region 1100S, the common source line CSL and the bit line BL adjacent to the first region 1100F may be provided therebetween with the memory cell strings CSTR that include the first transistors LT1 and LT2, the second transistors UT1 and UT2, and the memory cells transistors MCT disposed between the first transistors LT1 and LT2 and the second transistors UT1 and UT2 and also with the word lines WL connected to the memory cell strings CSTR. The common source line CSL may be provided in an upper portion of the second region 1100S, and the bit line BL may be provided in a lower portion of the second region 1100S.

Figure 2:
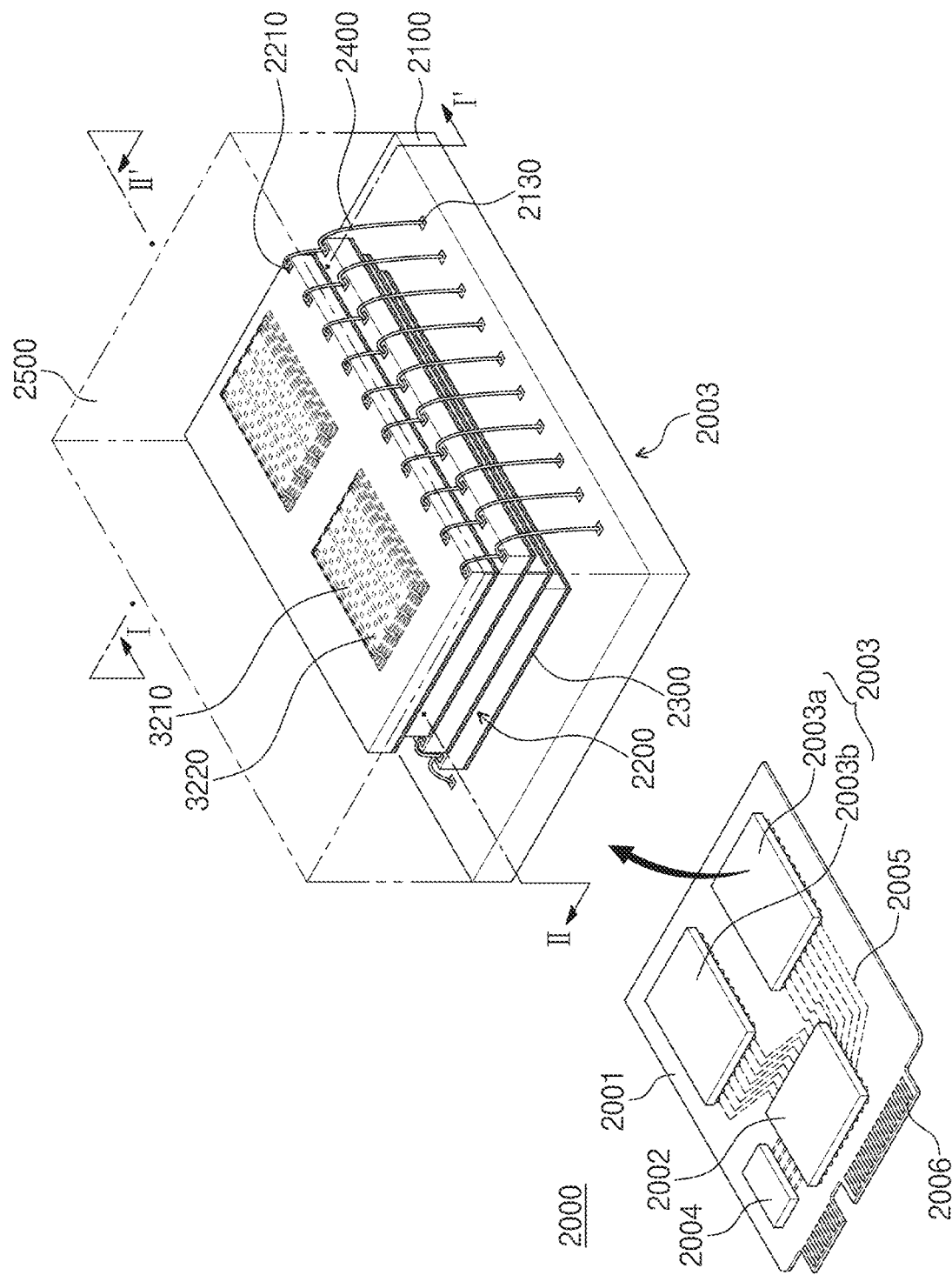
FIG. 2 illustrates a simplified perspective view showing an electronic system that includes a three-dimensional semiconductor memory device according to some embodiments of inventive concepts.

FIG. 2 illustrates a simplified perspective view showing an electronic system that includes a three-dimensional semiconductor memory device according to some embodiments of inventive concepts.

Referring to FIG. 2, an electronic system 2000 according to some embodiments of inventive concepts may include a main board 2001, a controller 2002 mounted on the main board 2001, at least one semiconductor package 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. The electronic system 2000 may communicate with the external host through one or more interfaces, for example, universal serial bus (USB), peripheral component interconnect express (PIC-Express), serial advanced technology attachment (SATA), and M-PHY for universal flash storage (UFS). For example, the electronic system 2000 may operate with power that is supplied through the connector 2006 from the external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesion layers 2300 disposed on bottom surfaces of the semiconductor chips 2200, connection structures 2400 that electrically connect the semiconductor chips 2200 to the package substrate 2100, and a molding layer 2500 on the package substrate 2100 and covering the semiconductor chips 2200 and the connection structures 2400.

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1A. Each of the semiconductor chips 2200 may include gate stack structures 3210 and vertical channel structures 3220. Each of the semiconductor chips 2200 may include a three-dimensional semiconductor memory device which will be discussed below.

For example, the connection structures 2400 may be bonding wires that electrically connect the input/output pads 2210 to the package upper pads 2130. On each of the first and second semiconductor packages 2003a and 2003b, the semiconductor chips 2200 may be electrically connected to each other in a wire bonding manner, and may be electrically connected to the package upper pads 2130 of the package substrate 2100. In some embodiments, on each of the first and second semiconductor packages 2003a and 2003b, the semiconductor chips 2200 may be electrically connected to each other using through-silicon vias (TSVs) instead of the connection structures 2400 or the bonding wires.

For example, the controller 2002 and the semiconductor chips 2200 may be included in a single package. For example, the controller 2002 and the semiconductor chips 2200 may be mounted on a separate interposer substrate other than the main board 2001, and may be connected to each other through wiring lines provided in the interposer substrate.

Figure 3:
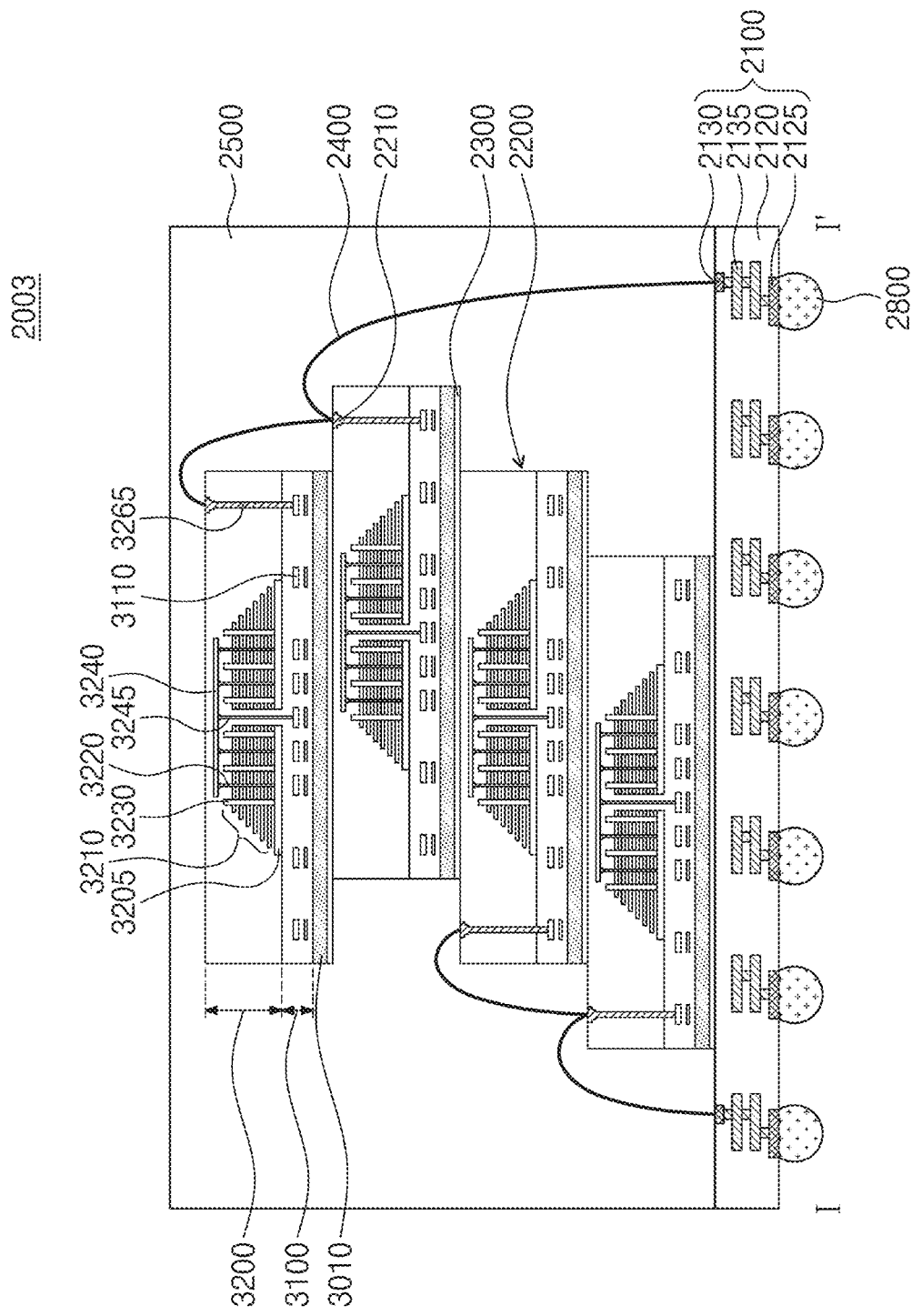
FIGS. 3 and 4 illustrate cross-sectional views respectively taken along lines I-I' and II-IP of FIG. 2, showing a semiconductor package that includes a three-dimensional semiconductor memory device according to some embodiments of inventive concepts.
Figure 4:
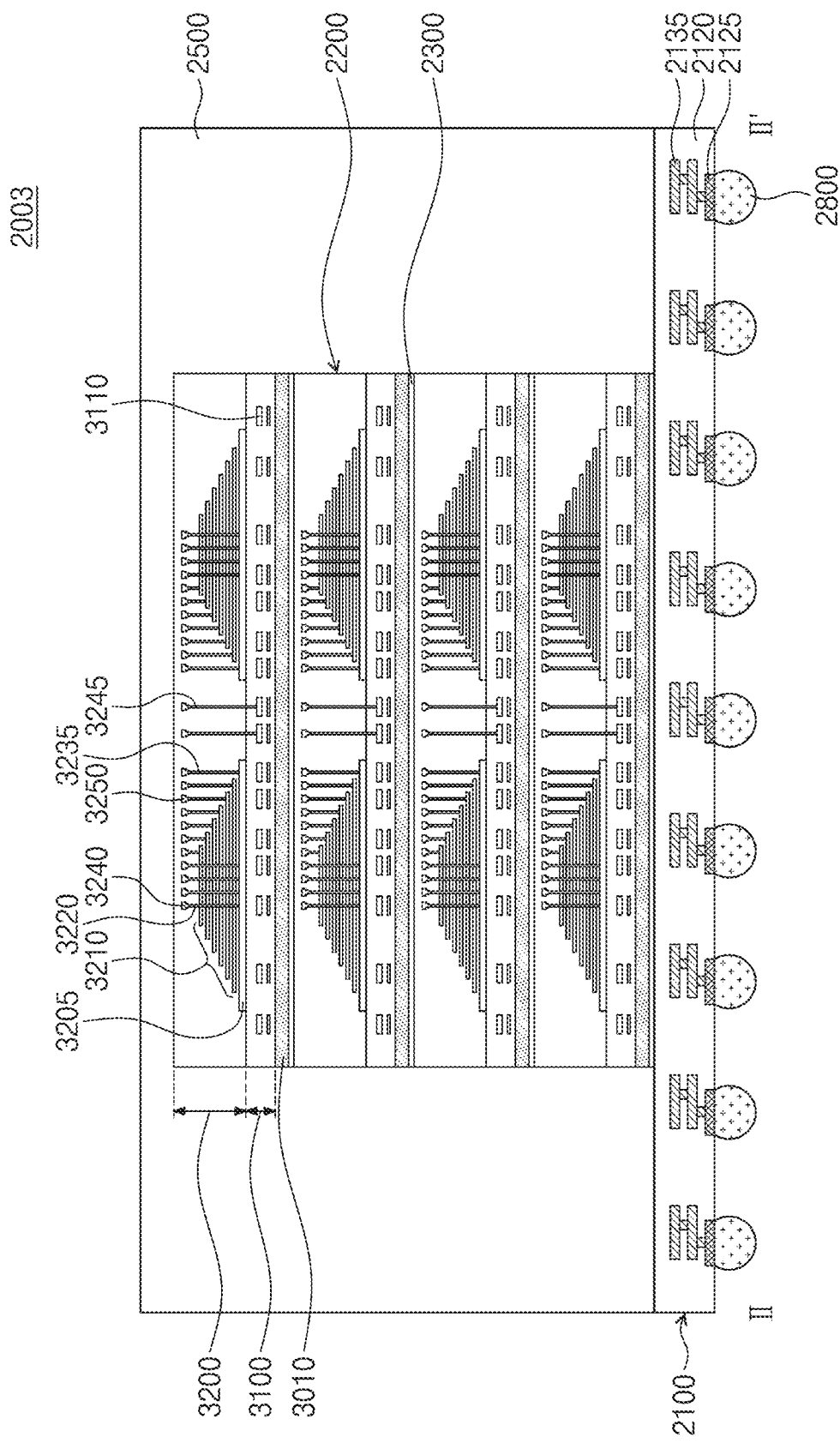

FIGS. 3 and 4 illustrate cross-sectional views respectively taken along lines I-I' and II-II' of FIG. 2, showing a semiconductor package that includes a three-dimensional semiconductor memory device according to some embodiments of inventive concepts.

Referring to FIGS. 3 and 4, the semiconductor package 2003 may include a package substrate 2100, a plurality of semiconductor chips 2200 on the package substrate 2100, and a molding layer 2500 that covers the package substrate 2100 and the plurality of semiconductor chips 2200.

The package substrate 2100 may include a package substrate body 2120, package upper pads 2130 disposed on a top surface of the package substrate body 2120, package lower pads 2125 disposed or exposed on a bottom surface of the package substrate body 2120, and internal lines 2135 through which the package upper pads 2130 and the package lower pads 2125 are connected to each other in the package substrate body 2120. The package upper pads 2130 may be electrically connected to connection structures 2400. The package lower pads 2125 may be connected through conductive connectors 2800 to the wiring patterns 2005 in the main board 2001 of the electronic system 2000 depicted in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral lines 3110. The second structure 3200 may include a common source line 3205, a gate stack structure 3210 on the common source line 3205, vertical channel structures 3220 and separation structures 3230 that penetrate the gate stack structure 3210, bit lines 3240 electrically connected to the vertical channel structures 3220, conductive lines 3250 and gate connection lines 3235 electrically connected to the word lines (see WL of FIG. 1A) of the gate stack structure 3210. Each of the gate connection lines 3235 may be electrically connected to one of the word lines WL. At least one of the gate connection lines 3235 may be electrically connected to the common source line 3205.

Each of the semiconductor chips 2200 may include one or more through lines 3245 that electrically connect with the peripheral lines 3110 of the first structure 3100 and extend into the second structure 3200. The through line 3245 may penetrate the gate stack structure 3210 and may be disposed outside the gate stack structure 3210. Each of the semiconductor chips 2200 may further include an input/output connection line 3265 that has electrical connection with the peripheral line 3110 of the first structure 3100 and extends into the second structure 3200, and may also further include an input/output pad 2210 electrically connected to the input/output connection line 3265.

Figure 5:
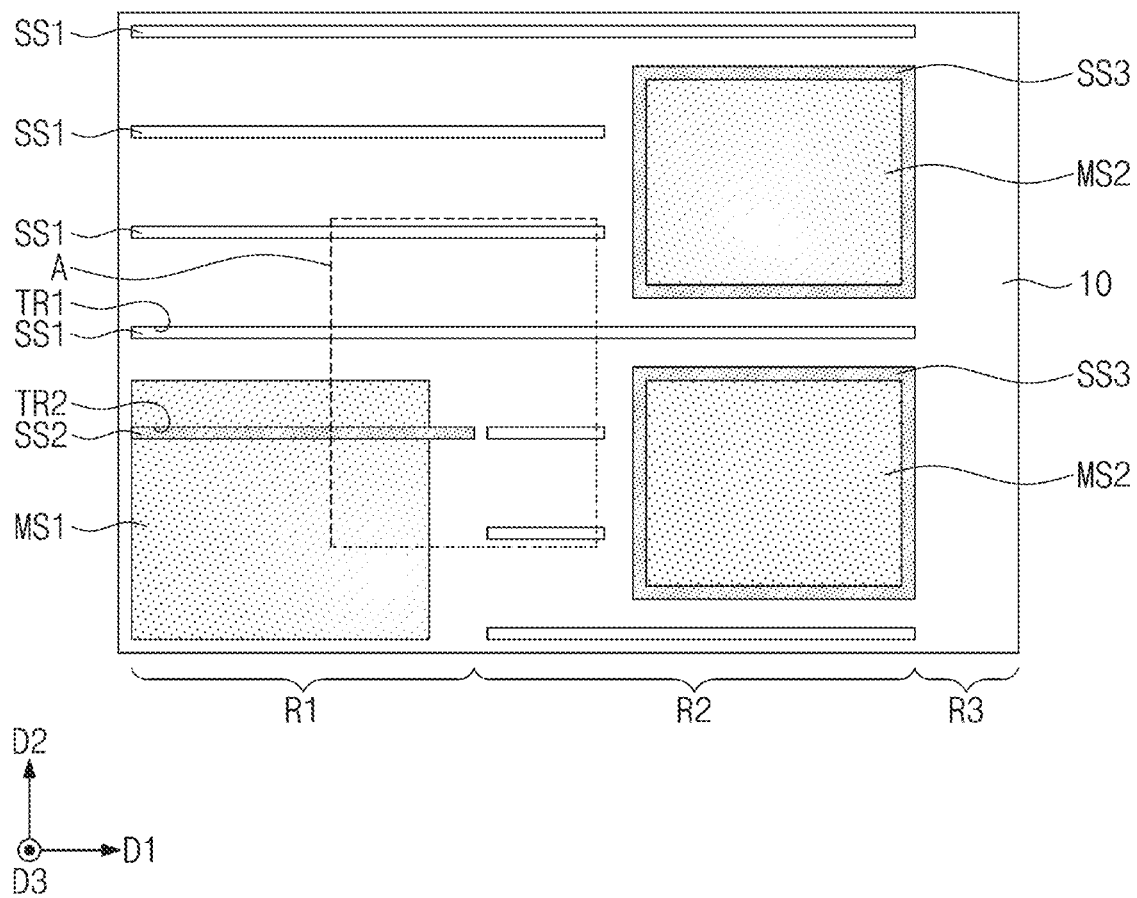
FIG. 5 illustrates a plan view showing a three-dimensional semiconductor memory device according to some embodiments of inventive concepts.
Figure 6A:
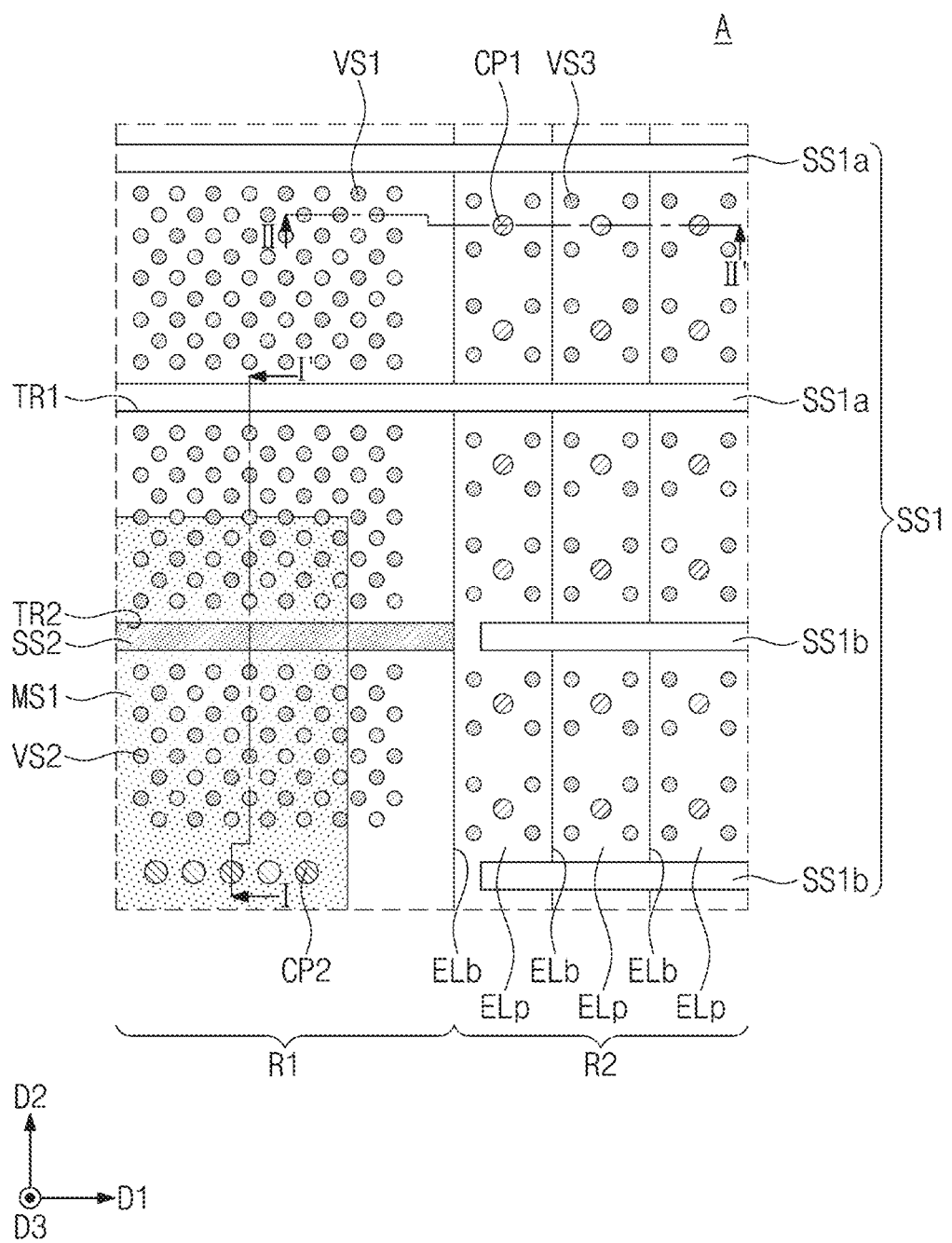
FIGS. 6A and 6B illustrate enlarged plan views of section A depicted in FIG. 5, partially showing a three-dimensional semiconductor memory device according to some embodiments of inventive concepts.
Figure 6B:
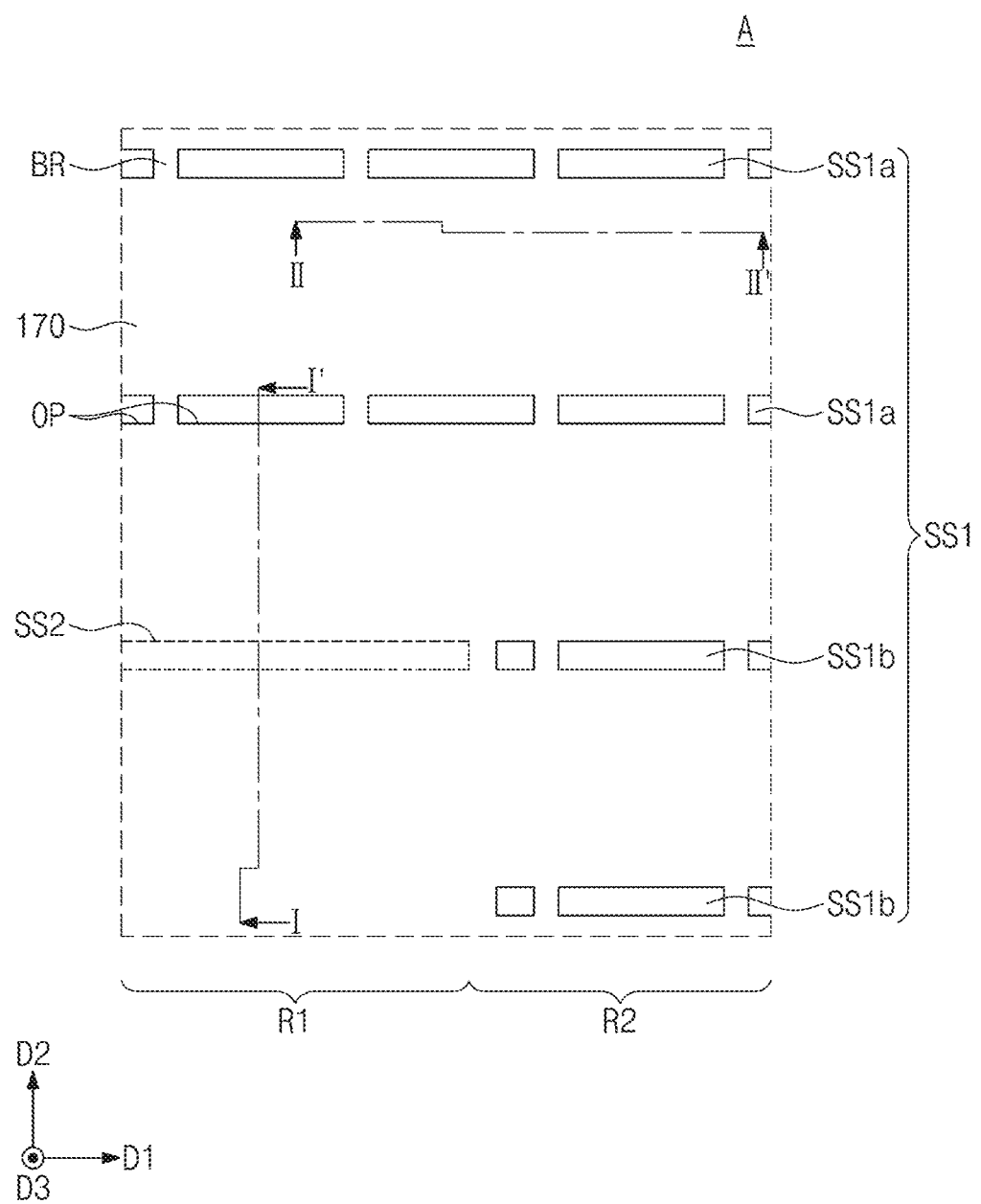
Figure 7:
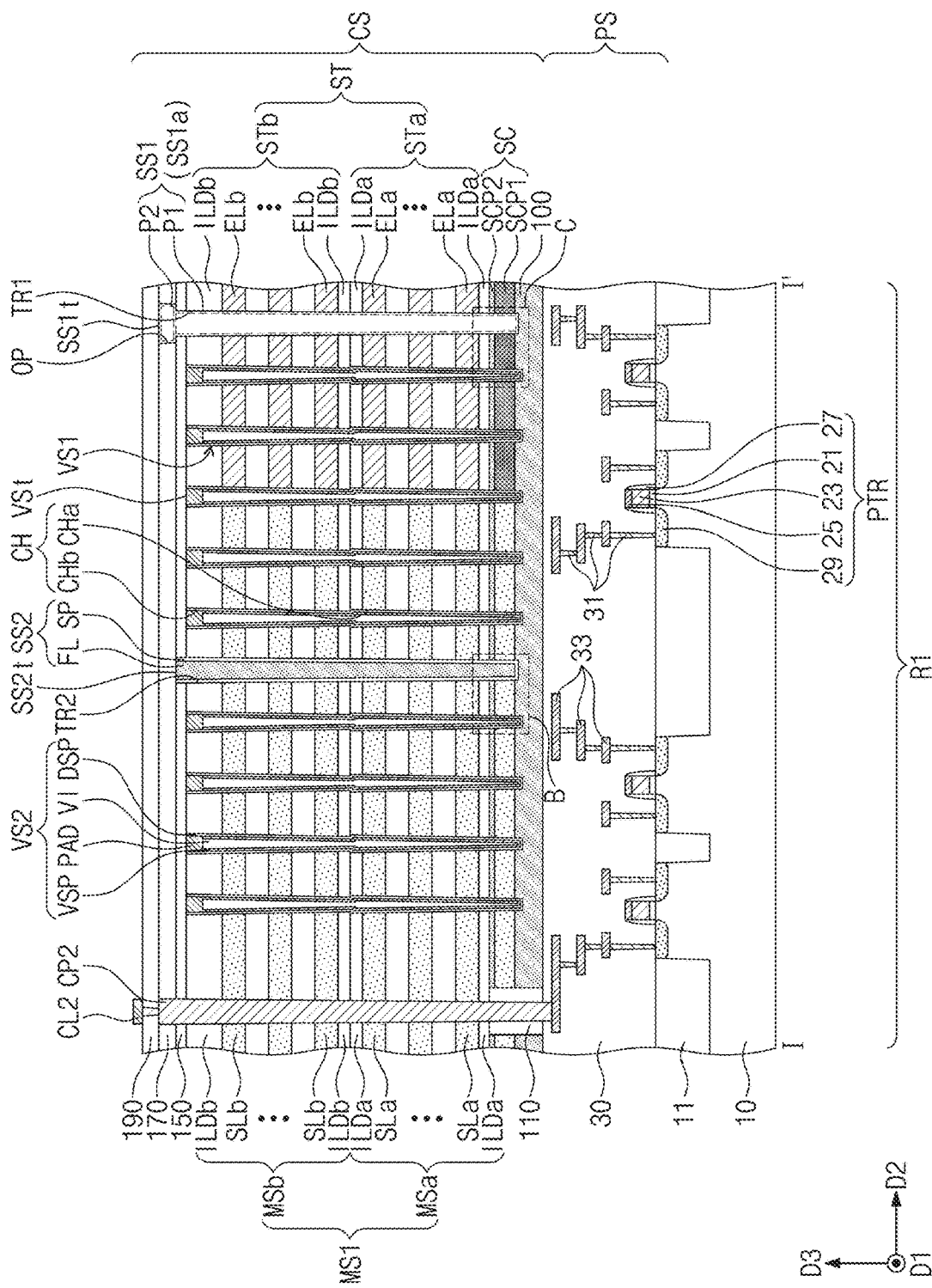
FIGS. 7 and 8 illustrate cross-sectional views respectively taken along lines I-I' and II-II' of FIG. 6A or 6B, showing a three-dimensional semiconductor memory device according to some embodiments of inventive concepts.
Figure 8:
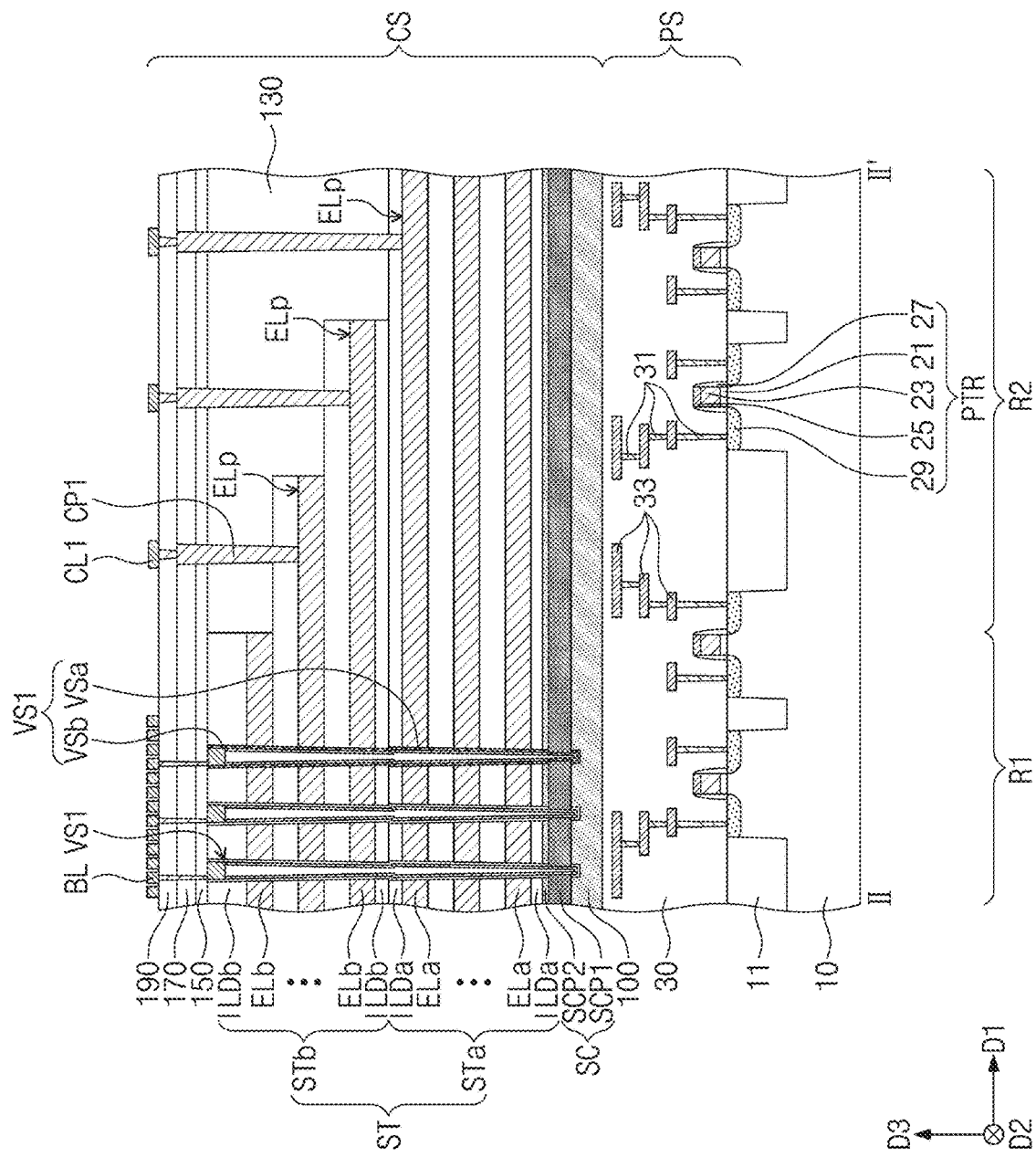

FIG. 5 illustrates a plan view showing a three-dimensional semiconductor memory device according to some embodiments of inventive concepts. FIGS. 6A and 6B illustrate enlarged plan views of section A depicted in FIG. 5, partially showing a three-dimensional semiconductor memory device according to some embodiments of inventive concepts. FIGS. 7 and 8 illustrate cross-sectional views respectively taken along lines I-I' and II-II' of FIG. 6A or 6B, showing a three-dimensional semiconductor memory device according to some embodiments of inventive concepts.

Referring to FIGS. 5, 6A, 6B, 7, and 8, a first substrate 10 may be provided which includes a first region R1, a second region R2, and a third region R3. The first substrate 10 may extend in a first direction D1 that is directed from the first region R1 toward the third region R3 and in a second direction D2 that intersects the first direction D1. The first substrate 10 may have a top surface perpendicular to a third direction D3 that intersects the first and second directions D1 and D2. For example, the first, second, and third directions D1, D2, and D3 may be orthogonal to each other.

The second region R2 may extend in the first direction D1 from the first region RE The third region R3 may extend in the first direction D1 from the second region R2. The first region R1 may be an area where are provided the vertical channel structures 3220, the separation structures 3230, and the bit lines 3240 electrically connected to the vertical channel structures 3220, all of which structures 3220, 3230, and 3240 are discussed with reference to FIGS. 3 and 4. The second region R2 may be an area where is provided a stepwise structure including pad portions ELp which will be discussed below. The third region R3 may be an area where is provided the input/output connection line 3265 or the through line 3245 discussed with reference to FIGS. 3 and 4.

The first substrate 10 may be, for example, a silicon substrate, a silicon-germanium substrate, a germanium substrate, or a monocrystalline epitaxial layer grown on a monocrystalline silicon substrate. A device isolation layer 11 may be provided in the first substrate 10. The device isolation layer 11 may define an active section of the first substrate 10. The device isolation layer 11 may include, for example, silicon oxide.

A peripheral circuit structure PS may be provided on the first substrate 10. The peripheral circuit structure PS may include peripheral circuit transistors PTR on the active section of the first substrate 10, peripheral circuit contact plugs 31, peripheral circuit lines 33 electrically connected through the peripheral circuit contact plugs 31 to the peripheral circuit transistors PTR, and a first dielectric layer 30 that surrounds the peripheral circuit transistors PTR, the peripheral circuit contact plugs 31, and the peripheral circuit lines 33. The peripheral circuit structure PS may correspond to the first region 1100F of FIG. 1A, and the peripheral circuit lines 33 may correspond to the peripheral lines 3110 of FIGS. 3 and 4.

A peripheral circuit may be constituted by the peripheral circuit transistors PTR, the peripheral circuit contact plugs 31, and the peripheral circuit lines 33. For example, the peripheral circuit transistors PTR may constitute the decoder circuit 1110, the page buffer 1120, and the logic circuit 1130 that are discussed in FIG. 1A. In more detail, each of the peripheral circuit transistors PTR may include a peripheral gate dielectric layer 21, a peripheral gate electrode 23, a peripheral capping pattern 25, a peripheral gate spacer 27, and peripheral source/drain sections 29.

The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover sidewalls of the peripheral gate dielectric layer 21, the peripheral gate electrode 23, and the peripheral capping pattern 25. The peripheral source/drain sections 29 may be provided in the first substrate 10 adjacent to opposite sides of the peripheral gate electrode 23.

The peripheral circuit lines 33 may be electrically connected through the peripheral circuit contact plugs 31 to the peripheral circuit transistors PTR. Each of the peripheral circuit transistors PTR may be, for example, an NMOS transistor, a PMOS transistor, or a gate-all-around type transistor. For example, the peripheral circuit contact plugs 31 may have their widths that increase with decreasing distance from the first substrate 10. The peripheral circuit contact plugs 31 and the peripheral circuit lines 33 may include a conductive material, such as metal.

The first dielectric layer 30 may be disposed on the top surface of first substrate 10. On the first substrate 10, the first dielectric layer 30 may cover the peripheral circuit transistors PTR, the peripheral circuit contact plugs 31, and the peripheral circuit lines 33. The first dielectric layer 30 may include a plurality of dielectric layers that constitute a multi-layered structure. For example, the first dielectric layer 30 may include one or more of silicon oxide, silicon nitride, silicon oxynitride, and low-k dielectric materials.

The peripheral circuit structure PS may be provided thereon with a cell array structure CS that includes a second substrate 100, a stack structure ST, first and second mold structures MS1 and MS2, first and second separation structures SS1 and SS2, first to third vertical channel structures VS, and first and second contact plugs CP1 and CP2. The following will describe in detail a structure of the cell array structure CS.

The second substrate 100 may be provided on the first dielectric layer 30 on the first and second regions R1 and R2. The second substrate 100 may extend in the first direction D1 and the second direction D2. The second substrate 100 may not be provided on the third region R3. The second substrate 100 may be a semiconductor substrate including a semiconductor material. The second substrate 100 may include, for example, silicon (Si), germanium (Ge), silicon germanium (SiGe), gallium arsenic (GaAs), indium-gallium-arsenic (InGaAs), aluminum-gallium-arsenic (AlGaAs), or a mixture thereof.

The second substrate 100 may be provided therein with a lower dielectric pattern 110 that defines an area where are provided second contact plugs CP2 which will be discussed below. When viewed in plan, the lower dielectric pattern 110 may surround the second substrate 100.

The stack structure ST may be provided on the second substrate 100. The stack structure ST may extend in the first direction D1 from the first region R1 toward the second region R2. The stack structure ST may correspond to the gate stack structure 3210 of FIGS. 3 and 4.

The stack structure ST may be provided in plural, and the plurality of stack structures ST may be arranged along the second direction D2. When viewed in plan, first separation structures SS1 may be provided in first trenches TR1 that run across in the first direction D1 between the plurality of stack structures ST. The first separation structures SS1 may extend from the first region R1 toward the second region R2. The plurality of stack structures ST may be spaced apart from each other in the second direction D2 across one of the first separation structures SS1.

The first separation structures SS1 may include first separation layers SS1a that extend from the first region R1 toward the second region R2, and may also include second separation layers SS1b provided on the second region R2. Each of the first separation layers SS1a may have a length in the first direction D1 greater than a length in the first direction D1 of each of the second separation layers SS1b. The first separation layers SS1a may be spaced apart in the second direction D2 from the second separation layers SS1b. One of the second separation layers SS1b may be adjacent in the first direction D1, for example, to the second separation structure SS2.

For convenience of description below, the following will discuss a single stack structure ST and a single first separation structure SS1, but this discussion will also be applied to other stack structures ST and other first separation structures SS1.

The stack structure ST may include interlayer dielectric layers ILDa and ILDb and gate electrodes ELa and ELb that are alternately and repeatedly stacked. The gate electrodes ELa and ELb may correspond to the word lines WL, the first lines LL1 and LL2, and the second lines UL1 and UL2 of FIG. 1A.

For example, the stack structure ST may include a lower stack structure STa on the second substrate 100 and an upper stack structure STb on the lower stack structure STa. The lower stack structure STa may include first interlayer dielectric layers ILDa and first gate electrodes ELa that are alternately and repeatedly stacked, and the upper stack structure STb may include second interlayer dielectric layers ILDb and second gate electrodes ELb that are alternately and repeatedly stacked.

The first and second gate electrodes ELa and ELb may have their lengths in the first direction D1 that decrease with increasing distance (or in the third direction D3) from the second substrate 100. For example, each of the first and second gate electrodes ELa and ELb may have a length in the first direction D1 that is greater than a length in the first direction D1 of a next overlying gate electrode. A lowermost one of the first gate electrodes ELa in the lower stack structure STa may the largest length in the first direction D1, and an uppermost one of the second gate electrodes ELb in the upper stack structure STb may have the smallest length in the first direction D1.

Referring to FIGS. 6A and 8, the first and second gate electrodes ELa and ELb may have their pad portions ELp on the second region R2. The pad portions ELp of the first and second gate electrodes ELa and ELb may be positioned horizontally and vertically at different locations. The pad portions ELp may constitute a stepwise structure along the first direction D1.

The stepwise structure may be arranged such that each of the lower and upper stack structures STa and STb may have a thickness which decreases with increasing distance from an outermost one of first vertical channel structures VS1 which will be discussed below, and that the first and second gate electrodes ELa and ELb may have their sidewalls which are spaced apart from each other along the first direction D1 at a regular interval when viewed in plan.

The first and second gate electrodes ELa and ELb may include, for example, at least one selected from doped semiconductors (e.g., doped silicon), metals (e.g., tungsten, copper, or aluminum), conductive metal nitrides (e.g., titanium nitride, or tantalum nitride), and transition metals (e.g., titanium or tantalum).

The first and second interlayer dielectric layers ILDa and ILDb may be provided between the first and second gate electrodes ELa and ELb. For example, likewise the first and second gate electrodes ELa and ELb, the first and second interlayer dielectric layers ILDa and ILDb may have their lengths in the first direction D1 that decrease with increasing distance from the second substrate 100.

A lowermost one of the second interlayer dielectric layers ILDb may be in contact with an uppermost one of the first interlayer dielectric layers ILDa. For example, each of the first and second interlayer dielectric layers ILDa and ILDb may have a thickness less than that of each of the first and second gate electrodes ELa and ELb. In this description, the term "thickness" may indicate a thickness in the third direction D3. For example, a lowermost one of the first interlayer dielectric layers ILDa may have a thickness less than that of each of other interlayer dielectric layers ILDa and ILDb. For example, an uppermost one of the second interlayer dielectric layers ILDb may have a thickness greater than that of each of other interlayer dielectric layers ILDa and ILDb. This, however, is merely an example, and the first and second interlayer dielectric layers ILDa and ILDb may have their thicknesses that are changed based on properties of a semiconductor device.

The first and second interlayer dielectric layers ILDa and ILDb may include, for example, one or more of silicon oxide, silicon nitride, silicon oxynitride, and low-k dielectric materials. For example, the first and second interlayer dielectric layers ILDa and ILDb may include high-density plasma (HDP) oxide or tetraethylorthosilicate (TEOS).

The second substrate 100 may be provided on its partial area with a first mold structure MS1 and a second mold structure MS2. The first mold structure MS1 may be provided on the first region R1, and the second mold structure MS2 may be provided on the second region R2. Each of the first and second mold structures MS1 and MS2 may be provided in plural. For convenience of description below, the following will discuss a single first mold structure MS1 and a single second mold structure MS2, but this description will also be applied to other first mold structures MS1 and other second mold structures MS2.

The first mold structure MS1 may be adjacent to the second separation structure SS2. The second separation structure SS2 may be provided in a second trench TR2 that runs across the first mold structure MS1 and extends in the first region RE For example, the second trench TR2 may extend in the first direction D1 in parallel to the first trenches TR1. The second mold structure MS2 may be surrounded by a third separation structure SS3.

Each of the first and second mold structures MS1 and MS2 may include interlayer dielectric layers ILDa and ILDb and sacrificial layers SLa and SLb that are alternately and repeatedly stacked. Each of the first and second mold structures MS1 and MS2 may include, for example, a lower mold structure MSa on the second substrate 100 and an upper mold structure MSb on the lower mold structure MSa. The lower mold structure MSa may include first interlayer dielectric layers ILDa and first sacrificial layers SLa that are alternately and repeatedly stacked, and the upper mold structure MSb may include second interlayer dielectric layers ILDb and second sacrificial layers SLb that are alternately and repeatedly stacked. The lower mold structure MSa may be located at the same level as that of the lower stack structure STa, and the upper mold structure MSb may be located at the same level as that of the upper stack structure Sm.

The first and second interlayer dielectric layers ILDa and ILDb of the lower and upper mold structures MSa and MSb may be located at their levels the same as those of the first and second interlayer dielectric layers ILDa and ILDb of the lower and upper stack structures STa and STb, and may include their materials the same as those of the first and second interlayer dielectric layers ILDa and ILDb of the lower and upper stack structures STa and STb. The first and second interlayer dielectric layers ILDa and ILDb of the lower and upper mold structures MSa and MSb may be connected integrally and correspondingly with the first and second interlayer dielectric layers ILDa and ILDb of the lower and upper stack structures STa and STb. The first and second sacrificial layers SLa and SLb of the lower and upper mold structures MSa and MSb may be located at their levels the same as those of the first and second gate electrodes ELa and ELb of the lower and upper stack structures STa and sm. The first and second sacrificial layers SLa and SLb of the lower and upper mold structures MSa and MSb may include their dielectric materials different from those of the first and second interlayer dielectric layers ILDa and ILDb of the lower and upper mold structures MSa and MSb. The first and second sacrificial layers SLa and SLb of the lower and upper mold structures MSa and MSb may include, for example, silicon nitride or silicon oxynitride.

A source structure SC may be provided between the second substrate 100 and the stack structure ST. The second substrate 100 and the source structure SC may correspond to the common source line CSL of FIG. 1A or the common source line 3205 of FIG. 4.

The source structure SC may extend in the first and second directions D1 and D2 in parallel to the first and second gate electrodes ELa and ELb. The source structure SC may include a first source conductive pattern SCP1 and a second source conductive pattern SCP2 that are sequentially stacked. The second source conductive pattern SCP2 may be provided between the first source conductive pattern SCP1 and the lowermost first interlayer dielectric layer ILDa. The first source conductive pattern SCP1 may have a thickness greater than that of the second source conductive pattern SCP2. Each of the first and second source conductive patterns SCP1 and SCP2 may include an impurity-doped semiconductor material. For example, the first source conductive pattern SCP1 may have an impurity concentration greater than that of the second source conductive pattern SCP2.

A lower sacrificial layer 101 and a lower semiconductor layer 103 may be provided between the second substrate 100 and the first mold structure MS1 and between the second substrate 100 and the second mold structure MS2. The lower sacrificial layer 101 may include a different dielectric material from that of the first and second interlayer dielectric layers ILDa and ILDb. The lower sacrificial layer 101 may include, for example, the same dielectric material as that of the first and second sacrificial layers SLa and SLb. The lower semiconductor layer 103 may include, for example, the same semiconductor material as that of the second substrate 100. The lower sacrificial layer 101 may be located at the same level as that of the first source conductive pattern SCP1 of the source structure SC. The lower semiconductor layer 103 may be located at the same level as that of the second source conductive pattern SCP2 of the source structure SC, may include the same material as that of the second source conductive pattern SCP2 of the source structure SC, and may be connected integrally with the second source conductive pattern SCP2 of the source structure SC.

The lower dielectric pattern 110 may extend from a sidewall of the second substrate 100 onto sidewalls of the lower sacrificial layer 101 and the lower semiconductor layer 103. A top surface of the lower dielectric pattern 110 may be substantially coplanar with that of the lower semiconductor layer 103, and a lower surface of the lower dielectric pattern 110 may be substantially the same as that of the second substrate 100.

On the first region R1, a plurality of first vertical channel structures VS1 may be provided to penetrate the stack structure ST and the source structure SC and to contact the second substrate 100. The first vertical channel structures VS1 may penetrate at least a portion of the second substrate 100, and each of the first vertical channel structures VS1 may have a bottom surface located at a lower level than that of a top surface of the second substrate 100 and that of a bottom surface of the source structure SC.

When viewed in plan, the first vertical channel structures VS1 may be arranged in a zigzag fashion along the first direction D1 or the second direction D2. The vertical channel structures VS1 may not be provided on the second region R2 and the third region R3. The first vertical channel structures VS1 may correspond to the vertical channel structures 3220 of FIGS. 2 to 4. The first vertical channel structures VS1 may correspond to channels of the first transistors LT1 and LT2 of FIG. 1A, channels of the memory cell transistors MCT of FIG. 1A, and channels of the second transistors UT1 and UT2 of FIG. 1A.

The first vertical channel structures VS1 may be provided in vertical channel holes CH that penetrate the stack structure ST. The first vertical channel structures VS1 may include lower vertical channel structures VSa correspondingly provided in lower vertical channel holes CHa that penetrate the lower stack structure STa, and may also include upper vertical channel structures VSb correspondingly provided in upper vertical channel holes CHb that penetrate the upper stack structure STb. The lower vertical channel structure VSa may be connected in the third direction D3 to the upper vertical channel structure VSb.

For example, each of the vertical channel structures VSa and VSb may have a width that increases in the third direction D3. The lower vertical channel structure VSa may have a width at an uppermost portion that is greater than a width at a lowermost portion of the upper vertical channel structure VSb. For example, each of the first vertical channel structures VS1 may have a sidewall that has a step difference at an interface between the lower vertical channel structure VSa and the upper vertical channel structure VSb. This, however, is merely an example, and inventive concepts are not limited thereto. For example, each of the first vertical channel structures VS1 may have a sidewall that has three or more step differences at different levels or that is flat with no step difference.

Each of the first vertical channel structures VS1 may include a data storage pattern DSP that is adjacent to the stack structure ST (or that covers an inner sidewall of the vertical channel hole CH), a vertical semiconductor pattern VSP that conformally covers an inner sidewall of the data storage pattern DSP, a buried dielectric pattern VI that fills an internal space surrounded by the vertical semiconductor pattern VSP, and a conductive pad PAD that is provided in a space surrounded by the buried dielectric pattern VI and the data storage pattern DSP. A top surface of each of the first vertical channel structures VS1 may have, for example, a circular shape, an oval shape, or a bar shape.

The vertical semiconductor pattern VSP may be provided between the data storage pattern DSP and the buried dielectric pattern VI. The vertical semiconductor pattern VSP may have a macaroni shape or a pipe shape whose bottom end is closed. The vertical semiconductor pattern VSP may be in contact with a portion of the source structure SC. The vertical semiconductor pattern VSP may include, for example, polysilicon.

The data storage pattern DSP may have a macaroni shape or a pipe shape whose bottom end is opened. The data storage pattern DSP may include a plurality of dielectric layers that are sequentially stacked. The buried dielectric pattern VI may include, for example, silicon oxide. The conductive pad PAD may include, for example, an impurity-doped semiconductor material or a conductive material.

On the first region R1, a plurality of second vertical channel structures VS2 may be provided to penetrate the first mold structure MS1, the lower semiconductor layer 103, and the lower sacrificial layer 101 and to contact the second substrate 100. The second vertical channel structures VS2 may be adjacent to the second separation structure SS2 and may be spaced apart from the first and second gate electrodes ELa and ELb of the stack structure ST. The second vertical channel structures VS2 may be formed simultaneously with the first vertical channel structures VS1, and may have a structure substantially the same as that of the first vertical channel structures VS1. In contrast, the data storage pattern DSP of the second vertical channel structures VS2 may have a macaroni shape or a pipe shape whose end is closed, and the vertical semiconductor pattern VSP of the second vertical channel structures VS2 may be completely surrounded by the data storage pattern DSP. When viewed in plan, the second vertical channel structures VS2 may be arranged in a zigzag fashion along the first direction D1 or the second direction D2.

On the second region R2, a plurality of third vertical channel structures VS3 may be provided to penetrate the source structure SC, the stack structure ST, and a second dielectric layer 130 which will be discussed below. For example, the third vertical channel structures VS3 may penetrate the pad portions ELp of the first and second gate electrodes ELa and ELb. The third vertical channel structures VS3 may be provided around first contact plugs CP1 which will be discussed below. The third vertical channel structures VS3 may not be provided on the first region RE The third vertical channel structures VS3 may be formed simultaneously with the first and second vertical channel structures VS1 and VS2, and may have substantially the same structure as that of the first and second vertical channel structures VS1 and VS2. Alternatively, the third vertical channel structures VS3 may not be provided in accordance with embodiments.

On the second and third regions R2 and R3, a second dielectric layer 130 may be provided to cover the stepwise structure of the stack structure ST. The second dielectric layer 130 may have a top surface that is substantially flat. The top surface of the second dielectric layer 130 may be substantially coplanar with an uppermost surface of the stack structure (or, a top surface of the uppermost second interlayer dielectric layer ILDb).

A third dielectric layer 150, a fourth dielectric layer 170, and a fifth dielectric layer 190 may be sequentially stacked on the stack structure ST, the first and second mold structures MS1 and MS2, and the second dielectric layer 130. Each of the second, third, fourth, and fifth dielectric layers 130, 150, 170, and 190 may include a dielectric material, for example, one or more of silicon oxide, silicon nitride, silicon oxynitride, and low-k dielectric materials.

Referring to FIG. 6B, the fourth dielectric layer 170 may include bridges BR. The bridges BR may be spaced apart in the first direction D1 from each other across a portion of the first separation structure SS1 provided in an opening OP. The bridges BR may extend in the second direction D2 on the first separation structure SS1. The fourth dielectric layer 170 including the bridges BR may limit, minimize, or prevent collapse of the first mold structure MS1 during fabrication of a three-dimensional semiconductor memory device which will be discussed below.

Referring to FIG. 7, the first separation structure SS1 may penetrate the third and fourth dielectric layers 150 and 170, the stack structure ST, and the source structure SC. The first separation structure SS1 may further penetrate the second dielectric layer 130 on the second region R2. The first separation structure SS1 may be spaced apart in the second direction D2 from the first vertical channel structures VS1.

The first separation structure SS1 may include a first part P1 provided in the first trench TR1 and a second part P2 provided on the first part P1 and in the opening OP. The first part P1 of the first separation structure SS1 may be in contact with a sidewall of the source structure SC and a sidewall of the stack structure ST. The first part P1 of the first separation structure SS1 may have a top surface substantially coplanar with that of the third dielectric layer 150. The first part P1 of the first separation structure SS1 may have a width in the second direction D2 less than a width in the second direction D2 of the second part P2 of the first separation structure SS1. The top surface of the first part P1 of the first separation structure SS1 may be located at substantially the same level as that of a top surface SS2t of the second separation structure SS2. The first separation structure SS1 may have a top surface SS1t substantially coplanar with a top surface of the fourth dielectric layer 170.

The second separation structure SS2 may penetrate the third dielectric layer 150, the first mold structure MS1, the lower semiconductor layer 103, and the lower sacrificial layer 101. The second separation structure SS2 may be provided in the second trench TR2. For example, the second separation structure SS2 may be provided on the first region R1. The second separation structure SS2 may be spaced apart in the second direction D2 from the second vertical channel structures VS2.

The top surface SS2t of the second separation structure SS2 may be substantially coplanar with the top surface of the third dielectric layer 150. The top surface SS2t of the second separation structure SS2 may be located at a lower level than that of the top surface SS1t of the first separation structure SS1. The top surface SS2t of the second separation structure SS2 may be located at a higher level than that of a top surface VSt of each of the first, second, and third channel structures VS1, VS2, and VS3.

On the second region R2, first contact plugs CP1 may be provided to penetrate the second, third, and fourth dielectric layers 130, 150, and 170. Each of the first contact plugs CP1 may further penetrate one of the interlayer dielectric layers ILDa and ILDb of the stack structure ST, and may contact and electrical connect with one of the gate electrodes ELa and ELb. The first contact plugs CP1 may be provided on the pad portions ELp. The first contact plugs CP1 may be spaced apart from the third vertical channel structures VS3. Each of the first contact plugs CP1 may have a height in the third direction D3 that increases with increasing distance from an outermost one of the first vertical channel structures VS1. The first contact plugs CP1 may correspond to the gate connection lines 3235 of FIG. 4.

On the first region R1, second contact plugs CP2 may be provided to penetrate the third and fourth dielectric layers 150 and 170, the first mold structure MS1, and the lower dielectric pattern 110. Each of the second contact plugs CP2 may further penetrate at least a portion of the first dielectric layer 30, and may be electrically connected to one of the peripheral circuit transistors PTR in the peripheral circuit structure PS. The second contact plugs CP2 may be spaced apart from the second vertical channel structures VS2. Each of the second contact plugs CP2 may have a height in the third direction D3 greater than the height in the third direction D3 of each of the first contact plugs CP1 and greater than a height in the third direction D3 of each of the first, second, and third vertical channel structures VS1, VS2, and VS3. The second contact plug CP2 may correspond to the through line 3245 or the input/output connection line 3265 discussed with reference to FIGS. 3 and 4.

The first and second separation structures SS1 and SS2 and the first and second contact plugs CP1 and CP2 may each have a width that increases in the third direction D3. The first and second contact plugs CP1 and CP2 may include a conductive material, such as metal.

The fifth dielectric layer 190 may be provided thereon with bit lines BL electrically connected to the first vertical channel structures VS1, first conductive lines CL1 electrically connected to the first contact plugs CP1, and second conductive lines CL2 electrically connected to the second contact plugs CP2. The bit lines BL and the first and second conductive lines CL1 and CL2 may include a conductive material, such as metal. The bit lines BL may correspond to the bit lines BL of FIG. 1A or the bit lines 3240 of FIGS. 3 and 4. The first and second conductive lines CL1 and CL2 may correspond to the conductive lines 3250 of FIG. 4. One of the second conductive lines CL2 may be electrically connected to a component that corresponds to the input/output pad 1101 of FIG. 1 or the input/output pad 2210 of FIGS. 2 and 3.

The fifth dielectric layer 190 may be provided thereon with an additional dielectric layer that covers the first and second conductive lines CL1 and CL2 and also with additional wiring lines in the additional dielectric layer.

Figure 9A:
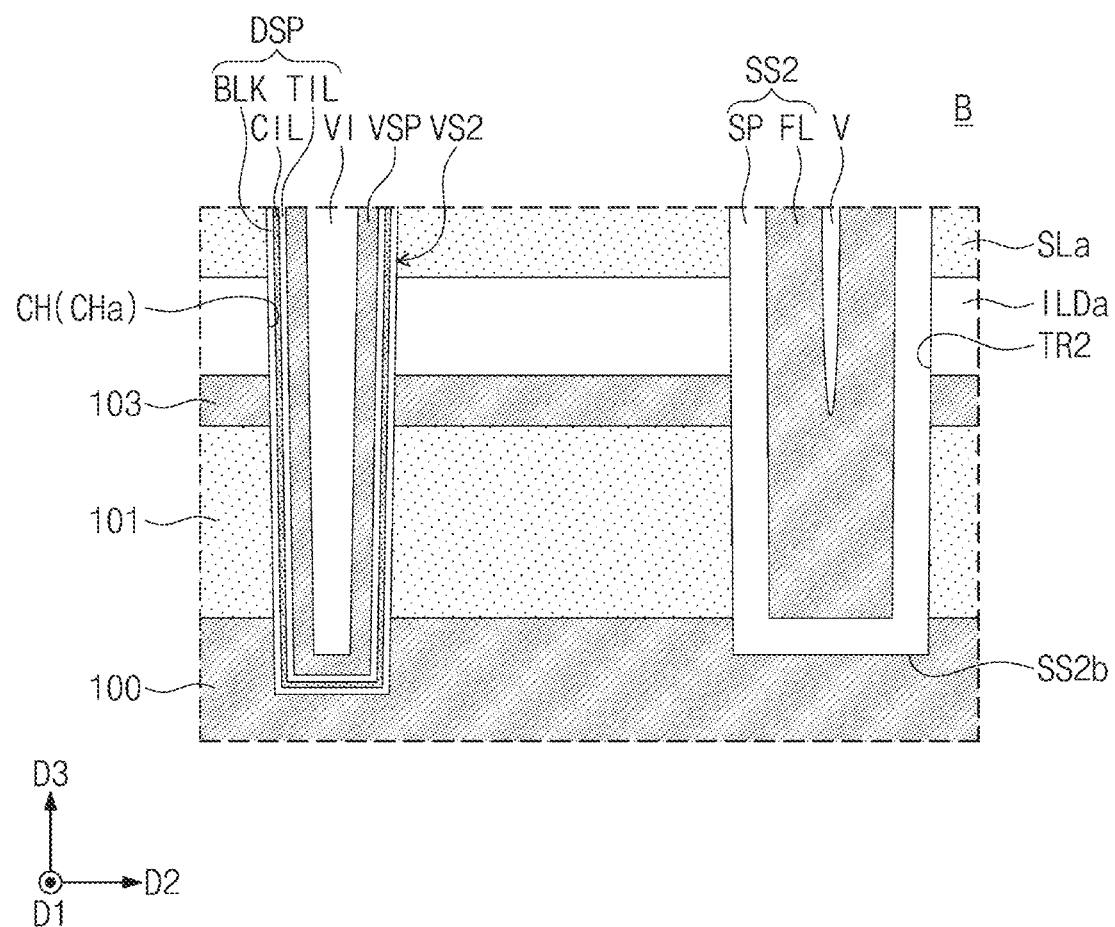
FIGS. 9A and 9B illustrate enlarged cross-sectional views of section B depicted in FIG. 7, partially showing a three-dimensional semiconductor memory device according to some embodiments of inventive concepts.

FIG. 9A illustrates an enlarged cross-sectional view of section B depicted in FIG. 7, partially showing a three-dimensional semiconductor memory device according to some embodiments of inventive concepts.

Referring to FIGS. 7, 8, and 9A, there may be illustrated the second separation structure SS2 and one of the second vertical channel structures VS2 that includes the data storage pattern DSP, the vertical semiconductor pattern VSP, and the buried dielectric pattern VI. For convenience of description, the following will discuss a single second vertical channel structure VS2.

The second separation structure SS2 may include a spacer part SP that conformally covers a bottom surface and a sidewall of the second trench TR2, and may also include a filler part FL that fills an internal space of the second trench TR2, which internal space is surrounded by the spacer part SP. The filler part FL may be spaced apart across the spacer part SP from the sidewall of the lower sacrificial layer 101 and from the sidewall of the lower semiconductor layer 103. The filler part FL may be spaced apart in the third direction D3 from the second substrate 100 across the spacer part SP. A bottom surface of the spacer part SP may be called a bottom surface SS2b of the second separation structure SS2 and may be located at a lower level than that of the top surface of the second substrate 100. The bottom surface SS2b of the second separation structure SS2 may be located at a higher level than that of a bottom surface of the second vertical channel structure VS2, but this is merely an example and inventive concepts are not limited thereto.

The spacer part SP and the filler part FL may include different materials from each other. The spacer part SP may include, for example, at least one selected from silicon oxide, silicon nitride, and silicon oxynitride. The filler part FL may include either a semiconductor material such as polysilicon or a metallic material such as tungsten. The filler part FL may include, for example, a void V therein.

The data storage pattern DSP may include a blocking dielectric layer BLK, a charge storage layer CIL, and a tunneling dielectric layer TIL that are sequentially stacked. The blocking dielectric layer BLK may cover an inner sidewall of the vertical channel hole CH. The tunneling dielectric layer TIL may be adjacent to the vertical semiconductor pattern VSP. The charge storage layer CIL may be interposed between the blocking dielectric layer BLK and the tunneling dielectric layer TIL.

The blocking dielectric layer BLK, the charge storage layer CIL, and the tunneling dielectric layer TIL may extend in the third direction D3 between the stack structure ST and the vertical semiconductor pattern VSP. The data storage pattern DSP may store and/or change data by using Fowler-Nordheim tunneling induced by a voltage difference between the vertical semiconductor pattern VSP and the first and second gate electrodes ELa and ELb. For example, the blocking dielectric layer BLK and the tunneling dielectric layer TIL may include silicon oxide, and the charge storage layer CIL may include silicon nitride or silicon oxynitride.

As shown in FIG. 9A, the data storage pattern DSP may have a sidewall in contact with that of the lower sacrificial layer 101 and that of the lower semiconductor layer 103. The second substrate 100 may be spaced apart in the third direction D3 from the vertical semiconductor pattern VSP across the data storage pattern DSP.

Figure 9B:
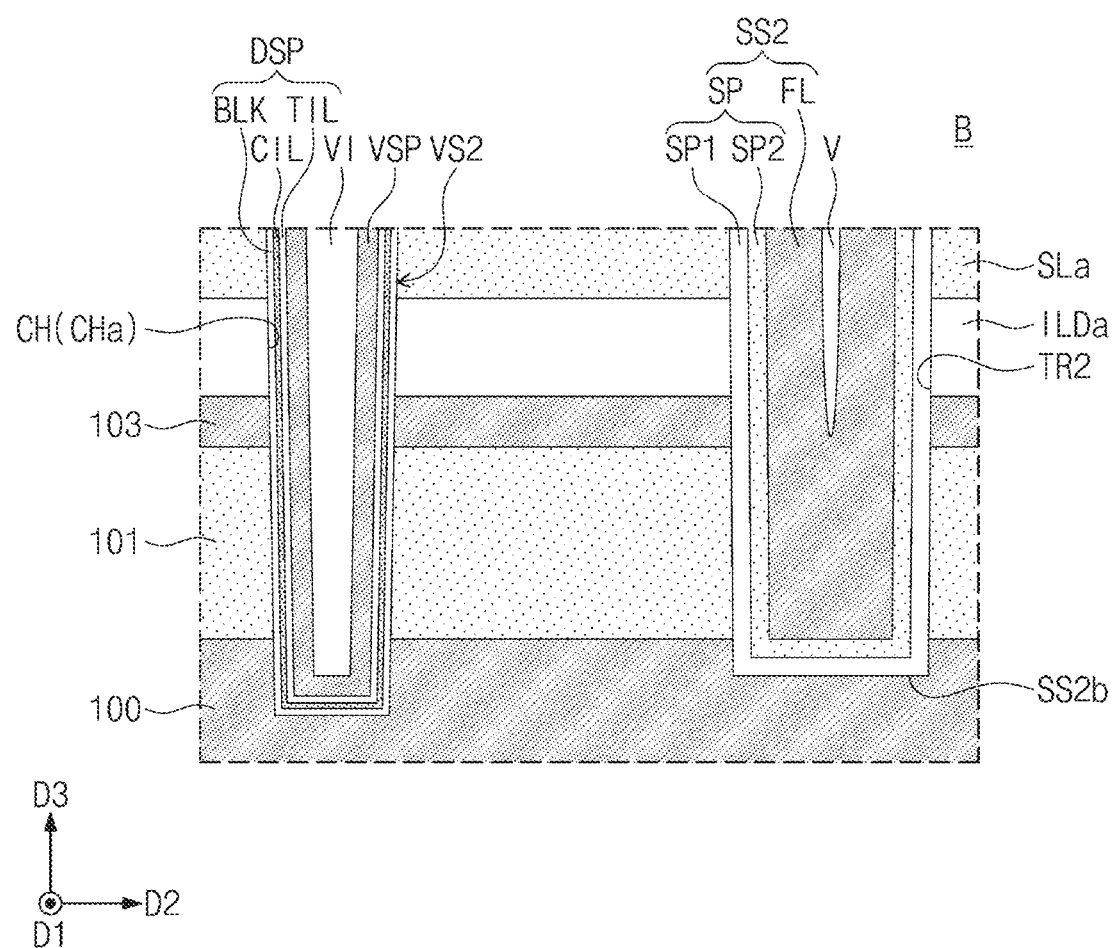

FIG. 9B illustrates an enlarged cross-sectional view of section B depicted in FIG. 7, partially showing a three-dimensional semiconductor memory device according to some embodiments of inventive concepts. For convenience of description below, omission will be made to avoid repetitive explanation of substantially the same components discussed with reference to the previous drawings, and differences will be described in detail Referring to FIGS. 7, 8, and 9B, the spacer part SP may include a first spacer SP1 that conformally covers an inner sidewall and a bottom surface of the second trench TR2, and may also include a second spacer SP2 on the first spacer SP1. The second spacer SP2 may be interposed between the first spacer SP1 and the filler part FL. The first spacer SP1 and the second spacer SP2 may include different materials from each other. For example, the first spacer SP1 may include silicon oxide, and the second spacer SP2 may include silicon nitride or silicon oxynitride.

Figure 10A:
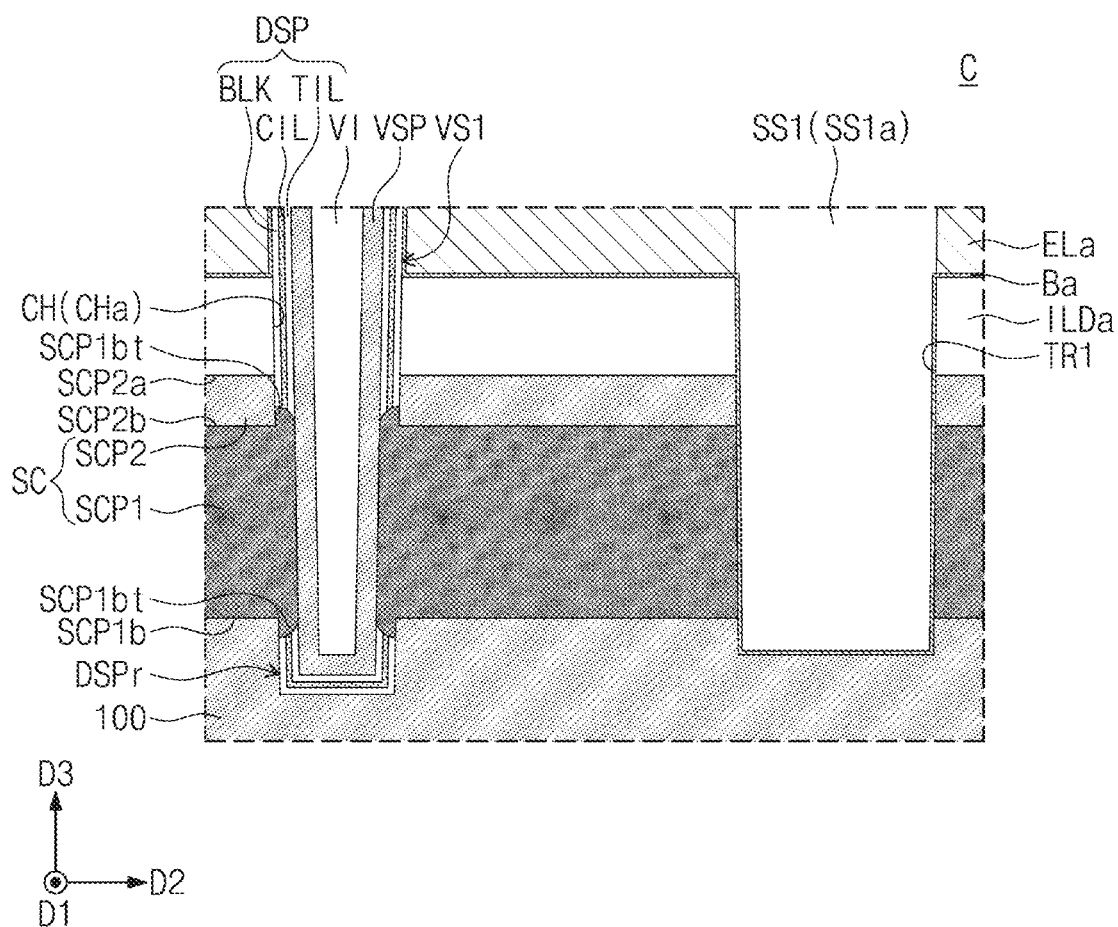
FIGS. 10A and 10B illustrate enlarged cross-sectional views of section C depicted in FIG. 7, partially showing a three-dimensional semiconductor memory device according to some embodiments of inventive concepts.

FIG. 10A illustrates an enlarged cross-sectional view of section C depicted in FIG. 7, partially showing a three-dimensional semiconductor memory device according to some embodiments of inventive concepts. For convenience of description below, omission will be made to avoid repetitive explanation of substantially the same components discussed with reference to the previous drawings, and differences will be described in detail Referring to FIGS. 7, 8, and 10A, there may be illustrated one of the first separation structures SS1 and one of the first vertical channel structures VS1 that includes the data storage pattern DSP, the vertical semiconductor pattern VSP, the buried dielectric pattern VI, and a lower data storage pattern DSPr. For convenience of description below, the following will discuss a single first vertical channel structure VS1 and a single first separation structure SS1.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protrusions SCP1*bt* located at a level higher than that of a bottom surface SCP2*b* of the second source conductive pattern SCP2 or lower than that of a bottom surface SCP1*b* of the first source conductive pattern SCP1. The protrusions SCP1*bt* may be located at a level lower than that of a top surface SCP2*a* of the second source conductive pattern SCP2. The protrusions SCP1*bt* may each have, for example, a curved shape at a surface in contact with the data storage pattern DSP or the lower data storage pattern DSPr.

A barrier layer Ba may be provided to cover an inner sidewall and a bottom surface of the first trench TR1. The barrier layer Ba may be interposed between the first separation structure SS1 and interlayer dielectric layers ILDa and ILDb, between the first separation structure SS1 and the source structure SC, and between the first separation structure SS1 and the second substrate 100. The barrier layer Ba may extend from the inner sidewall of the first trench TR1 onto the top and bottom surfaces and sidewalls of the gate electrodes ELa and ELb. The barrier layer Ba may include, for example, aluminum oxide.

Different from the second separation structure SS2 discussed with reference to FIGS. 9A and 9B, the first separation structure SS1 may have a single-layered structure including one dielectric material. The first separation structure SS1 may include, for example, silicon oxide.

Figure 10B:
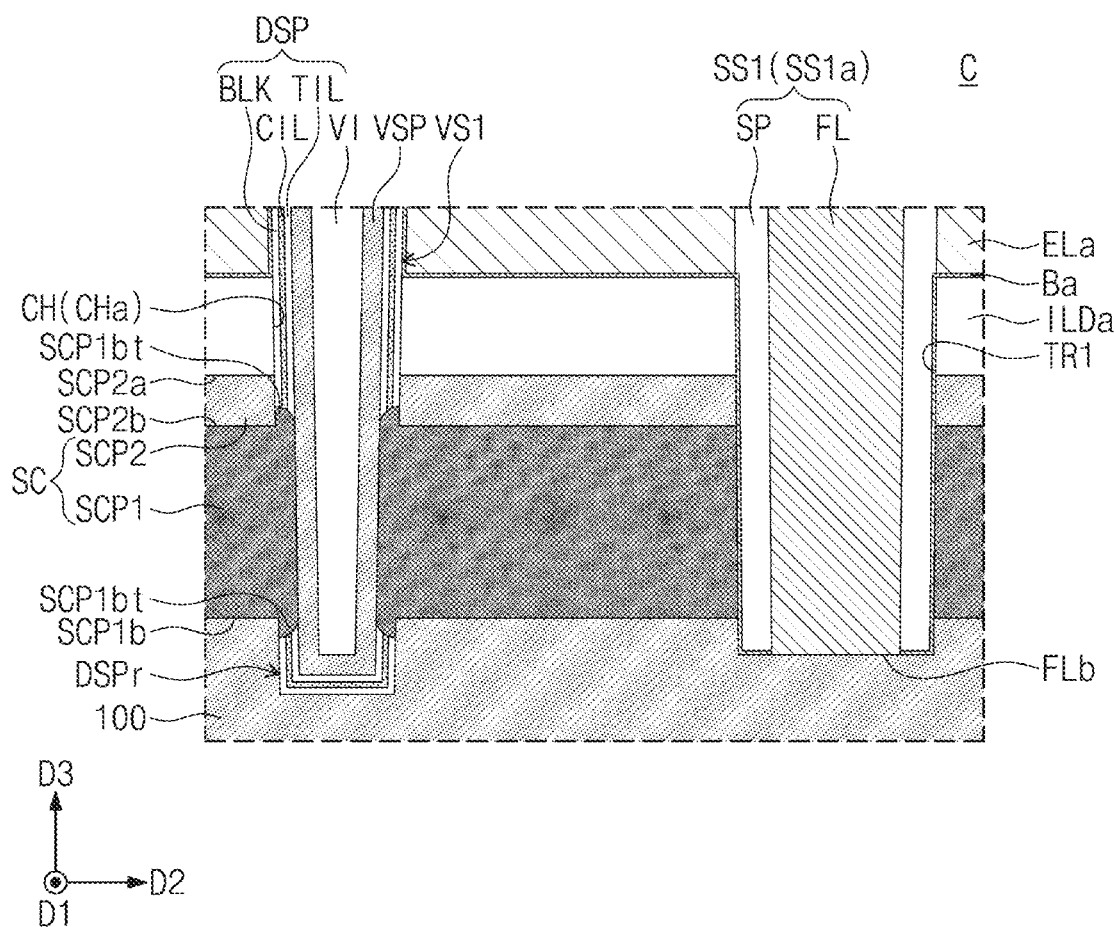

FIG. 10B illustrates an enlarged cross-sectional view of section C depicted in FIG. 7, partially showing a three-dimensional semiconductor memory device according to some embodiments of inventive concepts. For convenience of description below, omission will be made to avoid repetitive explanation of substantially the same components discussed with reference to the previous drawings, and differences will be described in detail Referring to FIGS. 7, 8, and 10B, the first separation structure SS1 may include a spacer part SP that covers a sidewall of the first trench TR1 and a filler part FL that fills an internal space of the first trench TR1, which internal space is surrounded by the spacer part SP. Different from the second separation structure SS2 discussed with FIGS. 9A and 9B, the spacer part SP of the first separation structure SS1 may not completely cover the bottom surface of the first trench TR1. The filler part FL of the first separation structure SS1 may be in direct contact with the second substrate 100, and may have a bottom surface FLb located at a lower level than that of the top surface of the second substrate 100.

The spacer part SP and the filler part FL of the first separation structure SS1 may include different materials from each other. The spacer part SP of the first separation structure SS1 may include, for example, at least one selected from silicon oxide, silicon nitride, and silicon oxynitride. The filler part FL of the first separation structure SS1 may include either a semiconductor material such as polysilicon or a metallic material such as tungsten.

Figure 11:
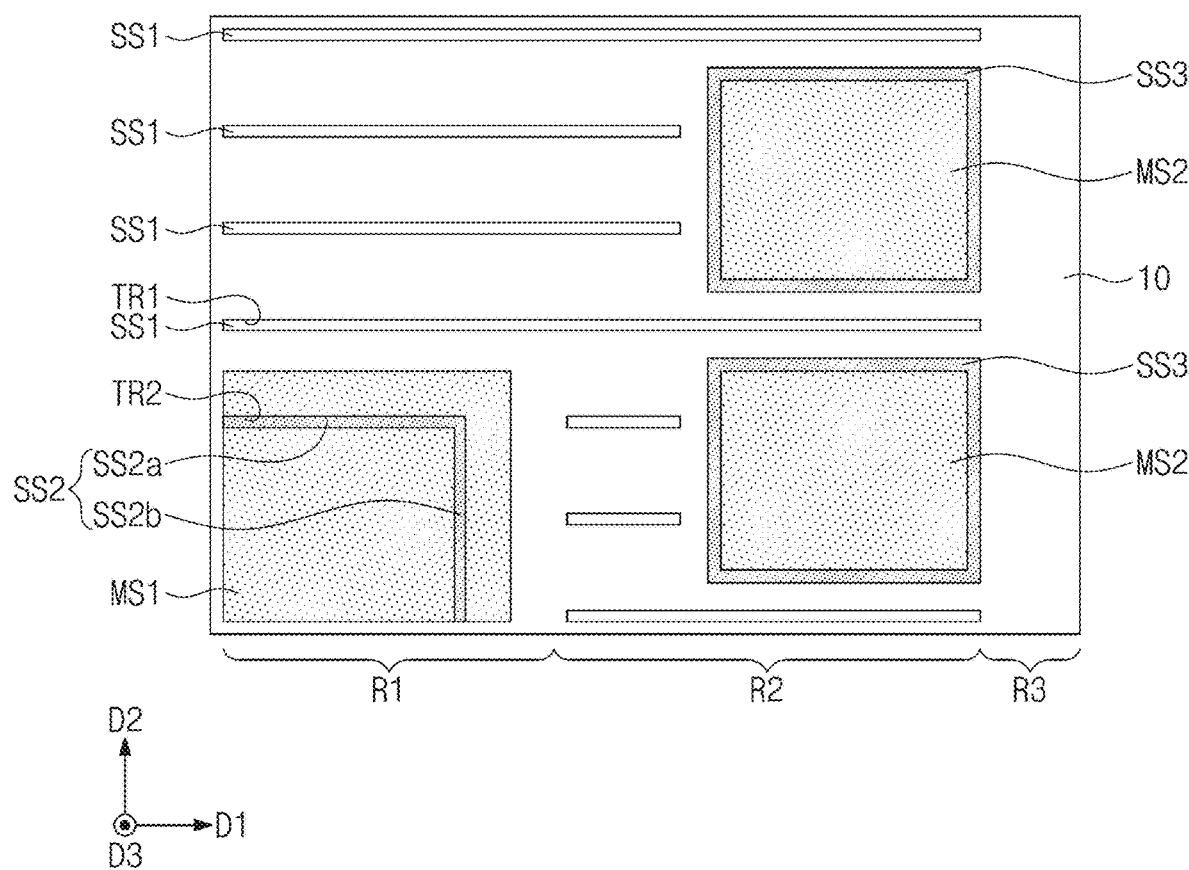
FIG. 11 illustrates a plan view showing a three-dimensional semiconductor memory device according to some embodiments of inventive concepts.

FIG. 11 illustrates a plan view showing a three-dimensional semiconductor memory device according to some embodiments of inventive concepts. For convenience of description below, omission will be made to avoid repetitive explanation of substantially the same components discussed with reference to the previous drawings, and differences will be described in detail Referring to FIG. 11, when viewed in plan, the second separation structure SS2 may include a first part SS2*a* that extends in the first direction D1, and may also include a second part SS2*b* that connects with the first part SS2*a* and extends in the second direction D2. At least a portion of the first mold structure MS1 may be surrounded by the second separation structure SS2 that includes the first part SS2*a* and the second part SS2*b*. According to some embodiments, each of the first and second parts SS2*a* and SS2*b* of the second separation structure SS2 may be provided in plural, and the first and second parts SS2a and SS2b may be connected to each other and may completely surround a portion of the first mold structure MS1.

FIGS. 12, 13, 14, and 15 illustrate cross-sectional views taken along line I-I' of FIG. 6A or 6B, showing a method of fabricating a three-dimensional semiconductor memory device according to some embodiments of inventive concepts. It will be hereinafter described about a method of fabricating a three-dimensional semiconductor memory device according to some embodiments of inventive concepts with reference to FIGS. 12 and 15.

Figure 12:
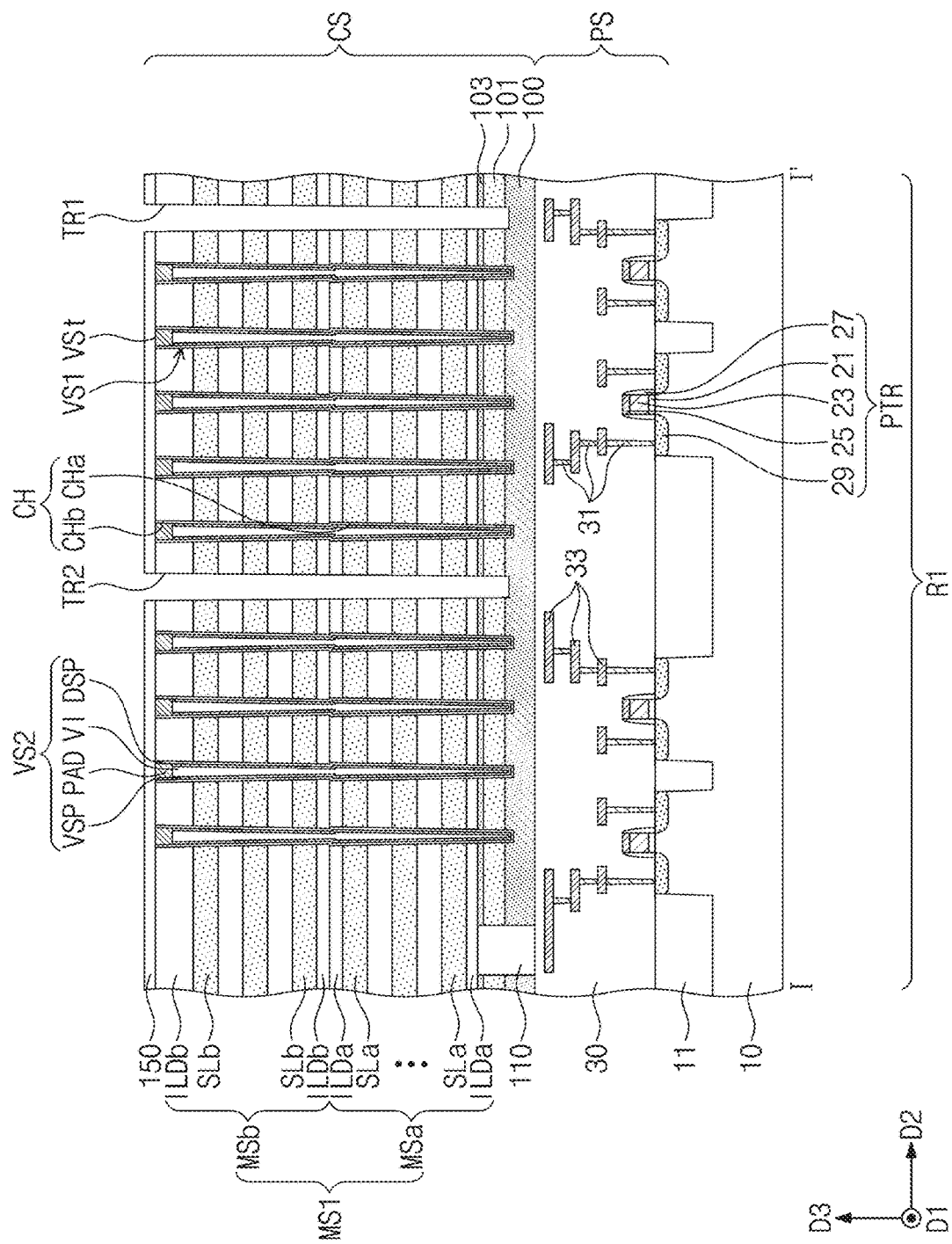
FIGS. 12, 13, 14, and 15 illustrate cross-sectional views taken along line I-I' of FIG. 6A or 6B, showing a method of fabricating a three-dimensional semiconductor memory device according to some embodiments of inventive concepts.

Referring to FIG. 12, a first substrate 10 may be provided which includes a first region R1, a second region R2, and a third region R3. A device isolation layer 11 may be formed in the first substrate 10, defining an active section. The device isolation layer 11 may be formed by forming a trench on an upper portion of the first substrate 10 and filling the trench with silicon oxide.

Peripheral circuit transistors PTR may be formed on the active section defined by the device isolation layer 11. There may be formed peripheral circuit lines 33 and peripheral circuit contact plugs 31 connected to peripheral source/drain sections 29 of the peripheral circuit transistors PTR. A first dielectric layer 30 may be formed to cover the peripheral circuit transistors PTR, the peripheral circuit contact plugs 31, and the peripheral circuit lines 33.

A second substrate 100, a lower sacrificial layer 101, and a lower semiconductor layer 103 may be sequentially formed on the first dielectric layer 30. The lower sacrificial layer 101 may be formed of, for example, silicon nitride. Alternatively, the lower sacrificial layer 101 may be formed by sequentially stacking a plurality of dielectric layers. The lower semiconductor layer 103 may be formed of, for example, the same material as that of the second substrate 100.

A lower dielectric pattern 110 may be formed in the second substrate 100. The formation of the lower dielectric pattern 110 may include patterning the second substrate 100, the lower sacrificial layer 101, and the lower semiconductor layer 103, allowing a dielectric material to fill a space from which are removed a portion of each of the second substrate 100, the lower sacrificial layer 101, and the lower semiconductor layer 103, and performing a planarization process. The formation of the lower dielectric pattern 110 may form a space where will be provided one of the second contact plugs CP2 discussed above. The lower dielectric pattern 110 may have a top surface substantially coplanar with that of the lower semiconductor layer 103. In this description below, the phrase "substantially coplanar with" may mean that a planarization process can be performed. The planarization process may include, for example, a chemical mechanical polishing (CMP) process or an etch-back process.

A first mold structure MS1 may be formed on the lower semiconductor layer 103. The formation of the first mold structure MS1 may include forming a lower mold structure MSa on the lower semiconductor layer 103 and forming an upper mold structure MSb on the lower mold structure MSa.

The formation of the lower mold structure MSa may include alternately and repeatedly stacking first interlayer dielectric layers ILDa and first sacrificial layers SLa on the lower semiconductor layer 103, and performing a trimming process on the first interlayer dielectric layers ILDa and the first sacrificial layers SLa.

The trimming process may include forming a mask pattern to cover an uppermost one of the first interlayer dielectric layers ILDa, using the mask pattern to partially pattern the first interlayer dielectric layers ILDa and the first sacrificial layers SLa, reducing an area of the mask pattern, and using the reduced mask pattern to partially pattern the first interlayer dielectric layers ILDa and the first sacrificial layers SLa. The mask-pattern reduction process may be performed repeatedly and alternately with the patterning process. The trimming process may cause the lower mold structure MSa to have a stepwise structure.

The formation of the upper mold structure MSb may include alternately and repeatedly stacking second interlayer dielectric layers ILDb and second sacrificial layers SLb on the lower mold structure MSa, and performing a trimming process on the second interlayer dielectric layers ILDb and the second sacrificial layers SLb. The trimming process may cause the upper mold structure MSb to have a stepwise structure.

The first and second sacrificial layers SLa and SLb may be formed of a dielectric material different from that of the first and second interlayer dielectric layers ILDa and ILDb. The first and second sacrificial layers SLa and SLb may be formed of a material having an etch selectivity with respect to the first and second interlayer dielectric layers ILDa and ILDb. For example, the first and second sacrificial layers SLa and SLb may be formed of silicon nitride, and the first and second interlayer dielectric layers ILDa and ILDb may be formed of silicon oxide. The first and second sacrificial layers SLa and SLb may be formed to have substantially the same thickness, and the first and second interlayer dielectric layers ILDa and ILDb may be formed to have their thicknesses that are changed at certain portions thereof.

After the formation of the lower and upper mold structures MSa and MSb each having the stepwise structure, a second dielectric layer 130 may be formed to cover the stepwise structures of the lower and upper mold structures MSa and MSb. The second dielectric layer 130 may have a top surface substantially coplanar with that of the first mold structure MS1 (or that of the upper mold structure MSb).

First, second, and third vertical channel structures VS1, VS2, and VS3 may be formed in vertical channel holes CH that penetrate the first mold structure MS1, the lower semiconductor layer 103, and the lower sacrificial layer 101. The formation of the first, second, and third vertical channel structures VS1, VS2, and VS3 may include forming lower vertical channel holes CHa that penetrate the lower mold structure MSa, the lower semiconductor layer 103, and the lower sacrificial layer 101 after the formation of the lower mold structure MSa, forming upper vertical channel holes CHb that penetrate the upper mold structure MSb and connect with the lower vertical channel holes CHa after the formation of the upper mold structure MSb on the lower mold structure MSa, and forming data storage patterns DSP, vertical semiconductor patterns VSP, buried dielectric patterns VI, and conductive pads PAD that fills the lower and upper vertical channel holes CHa and CHb.

After the formation of the first mold structure MS1 and the first, second, and third vertical channel structures VS1, VS2, and VS3, a third dielectric layer 150 may be formed to cover the top surface of the first mold structure MS1 and top surfaces of the first, second, and third vertical channel structures VS1, VS2, and VS3.

A first trench TR1 and a second trench TR2 may be formed to extend in a first direction D1 while penetrating the third dielectric layer 150, the first mold structure MS1, the lower semiconductor layer 103, and the lower sacrificial layer 101. The first trench TR1 may be adjacent to the first vertical channel structures VS1, and the second trench TR2 may be adjacent to the second vertical channel structures VS2.

Figure 13:
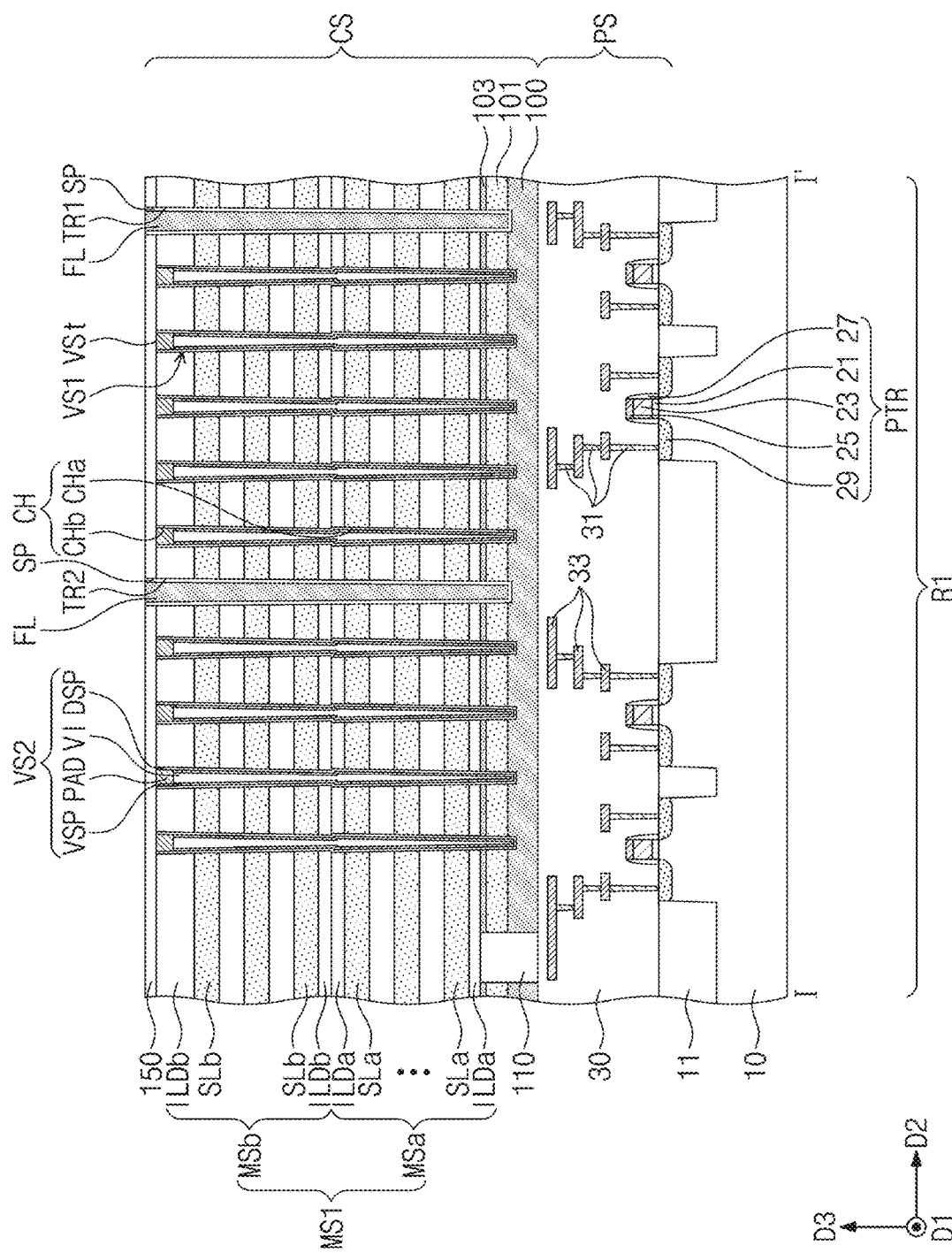
Figure 14:
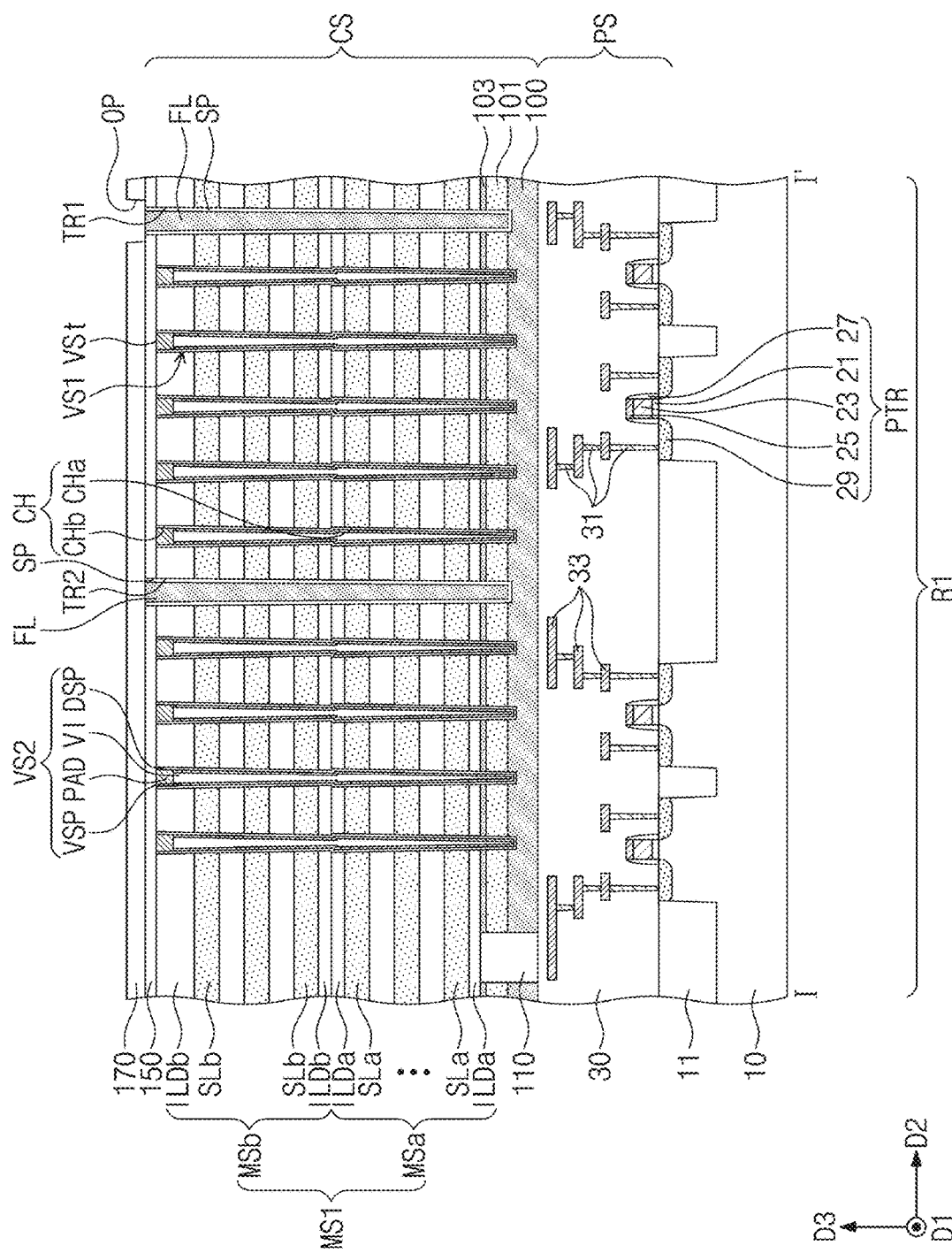

Referring to FIG. 13, a spacer part SP and a filler part FL may be formed to fill the first and second trenches TR1 and TR2. The spacer part SP may conformally cover an inner sidewall and a bottom surface of each of the first and second trenches TR1 and TR2, and the filler part FL may fill an internal space of each of the first and second trenches TR1 and TR2, which internal space is surrounded by the spacer part SP. An uppermost surface of the spacer part SP and a top surface of the filler part FL may be substantially coplanar with a top surface of the third dielectric layer 150.

Figure 15:
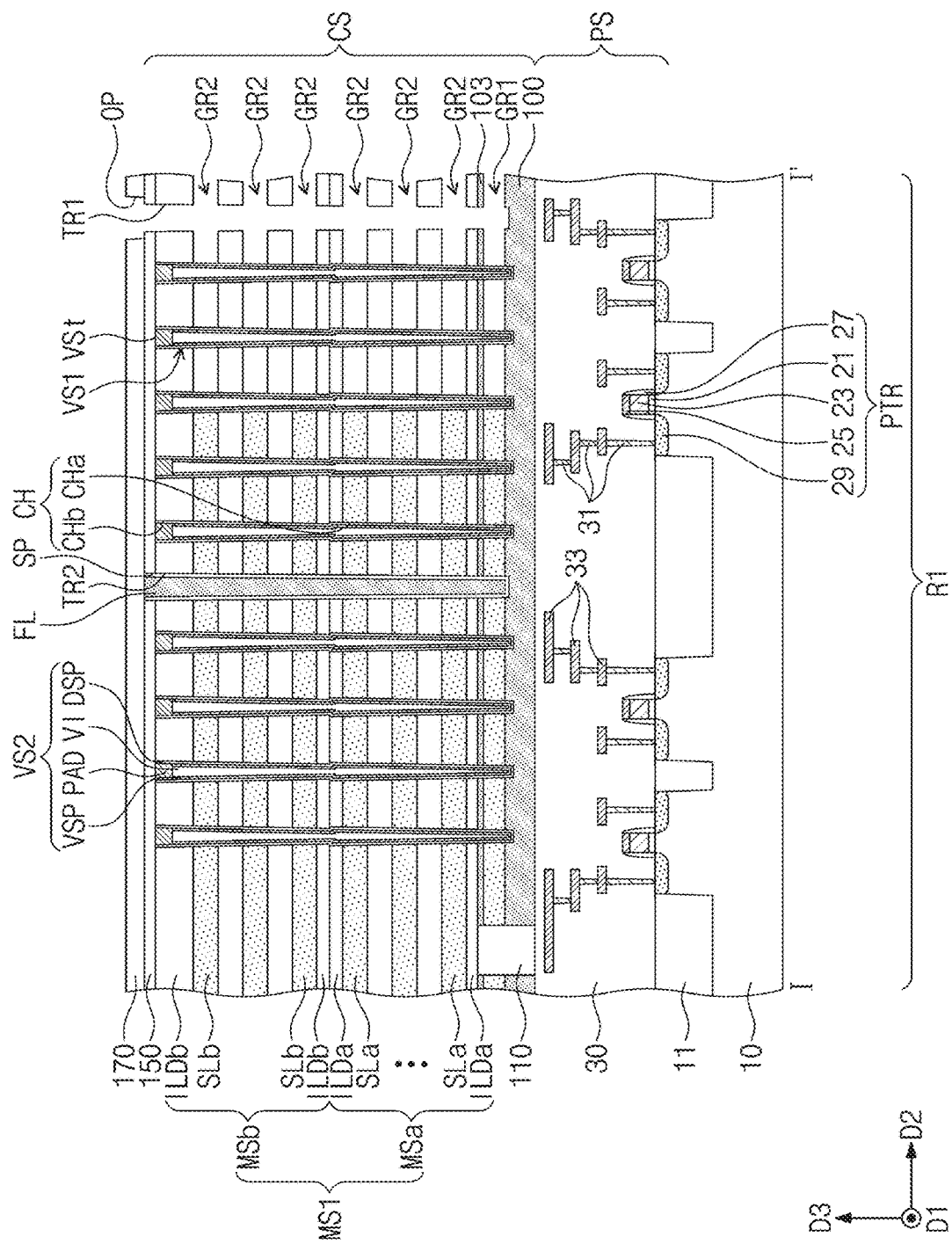

Referring to FIG. 15, a fourth dielectric layer 170 may be formed to cover the top surface of the third dielectric layer 150, the uppermost surface of the spacer part SP, and the top surface of the filler part FL. Afterwards, the fourth dielectric layer 170 may be partially patterned to form an opening OP on the first trench TR1. The opening OP may be spatially connected to the first trench TR1. The opening OP may not be formed on the second trench TR2.

Referring to FIG. 15, the spacer part SP and the filler part FL may be removed which are formed in the first trench TR1 and are exposed to the opening OP. Thereafter, each of the sacrificial layers 101, SLa, and SLb exposed to the first trench TR1 may be partially and selectively removed. The selective removal of the sacrificial layers 101, SLa, and SLb may be achieved by, for example, a wet etching process that uses an etching solution. The first and second interlayer dielectric layers ILDa and ILDb may not be removed while the sacrificial layers 101, SLa, and SLb are selectively removed.

The selective removal of the sacrificial layers 101, SLa, and SLb may form a first gap region GR1 defined as a space from which the lower sacrificial layer 101 is removed, and may also form second gap regions GR2 defined as spaces from which the first and second sacrificial layers SLa and SLb are removed. The first and second gap regions GR1 and GR2 may partially expose sidewalls of the first vertical channel structures VS1. For example, the first gap region GR1 may partially expose a sidewall of the vertical semiconductor pattern VSP of the first vertical channel structure VS1.

Referring back to FIGS. 5, 6A, 6B, 7, and 8, a first source conductive pattern SCP1 may be formed to fill the first gap region GR1. The lower semiconductor layer 103 on the first source conductive pattern SCP1 may be called a second source conductive pattern SCP2. Therefore, a source structure SC may be formed which includes the first and second source conductive patterns SCP1 and SCP2.

First and second gate electrodes ELa and ELb may be formed to fill the second gap regions GR2, and as a result a stack structure ST may be formed which includes the first and second gate electrodes ELa and ELb and the first and second interlayer dielectric layers ILDa and ILDb.

A first separation structure SS1 may be formed to fill the opening OP and the first trench TR1. A combination of the spacer part SP and the filler part FL that remain in the second trench TR2 may be called a second separation structure SS2. The first separation structure SS1 may have a top surface SS1t located at a higher level than that of a top surface SS2t of the second separation structure SS2. The first separation structure SS1 may have a height in a third direction D3 greater than a height in the third direction D3 of the second separation structure SS2.

On the first region R1, second contact plugs CP2 may be formed to penetrate the lower dielectric pattern 110 and the first mold structure MS1 where neither the dielectric layers 150 and 170 nor the sacrificial layers SLa and SLb are removed. Each of the second contact plugs CP2 may further penetrate at least a portion of the first dielectric layer 30, and may be electrically connected to one of the peripheral circuit transistors PTR in the peripheral circuit structure PS.

On the second region R2, first contact plugs CP1 may be formed to penetrate the second, third, and fourth dielectric layers 130, 150, and 170 and the first interlayer dielectric layers ILDa or the second interlayer dielectric layers ILDb of the stack structure ST. Each of the first contact plugs CP1 may be electrically connected to one of the first and second gate electrodes ELa and ELb.

A fifth dielectric layer 190 may be formed on the fourth dielectric layer 170, covering top surfaces of the first and second contact plugs CP1 and CP2 and a top surface of the first separation structure SS1. On the fifth dielectric layer 190, there may be formed bit lines BL electrically connected to the first vertical channel structures VS1, first conductive lines CL1 electrically connected to the first contact plugs CP1, and second conductive lines CL2 electrically connected to the second contact plugs CP2.

According to a method of fabricating a three-dimensional semiconductor memory device in accordance with inventive concepts, because neither the spacer part SP nor the filler part FL is removed from the second trench TR2, spaces for the second contact plugs CP2 may be easily obtained to achieve simplification of fabrication process. In addition, an interval between the second contact plugs CP2 and the first and second gate electrodes ELa and ELb may be securely obtained due to the second separation structure SS2 within the second trench TR2.

According to a method of fabricating a three-dimensional semiconductor memory device in accordance with inventive concepts, because a dielectric layer for collapse of a mold structure is used not to remove a spacer part and a filler part in some of trenches, it may be possible to easily obtain spaces where will be provided contact plugs connected to a peripheral circuit and accordingly to accomplish simplification of fabrication process.

In addition, a separation structure may be used to securely obtain an interval between contact plugs and gate electrodes, and thus it may be possible not to improve reliability and electrical properties but also to reduce sizes of semiconductor chips of the three-dimensional semiconductor memory device according to inventive concepts.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although some embodiments of inventive concepts have been described, it will be understood by one of ordinary skill in the art that variations in form and detail may be made therein without departing from the spirit and essential features of inventive concepts. Thus, the above disclosed embodiments should be considered illustrative and not restrictive.

What is claimed is:

1. A three-dimensional semiconductor memory device, comprising:

a substrate including a first region and a second region;
a stack structure including a plurality of interlayer dielectric layers and a plurality of gate electrodes that are alternately and repeatedly stacked on the substrate, the stack structure having a stepwise structure on the second region;
a mold structure adjacent to the stack structure on the first region, the mold structure including a plurality of interlayer dielectric layers and a plurality of sacrificial layers that are alternately and repeatedly stacked on the substrate;
a first separation structure crossing the stack structure and extending along a first direction from the first region toward the second region; and
a second separation structure crossing the mold structure and extending in the first direction on the first region,
wherein a level of a top surface of the first separation structure is higher than a level of a top surface of the second separation structure.

2. The three-dimensional semiconductor memory device of claim 1, further comprising:
a contact plug penetrating the mold structure,
wherein the contact plug is spaced apart in a second direction across the second separation structure from the plurality of gate electrodes of the stack structure, the second direction intersecting the first direction.

3. The three-dimensional semiconductor memory device of claim 1,
wherein the first separation structure includes a first part and a second part on the first part, and
wherein a width of the first part is less than a width of the second part.

4. The three-dimensional semiconductor memory device of claim 1,
wherein the first separation structure has a single-layered structure including one dielectric material.

5. The three-dimensional semiconductor memory device of claim 1, wherein
the first separation structure is in a first trench crossing the stack structure,
the first separation structure includes a spacer part and a filler part,
the spacer part covers an inner sidewall of the first trench,
the filler part fills an internal space of the first trench, and
the internal space is surrounded by the spacer part.

6. The three-dimensional semiconductor memory device of claim 5, wherein the filler part of the first separation structure is in direct contact with the substrate.

7. The three-dimensional semiconductor memory device of claim 1, wherein
the second separation structure is in a second trench crossing the mold structure,
the second separation structure includes a spacer part and a filler part,
the spacer part conformally covers an inner sidewall of the second trench and a bottom surface of the second trench,
the filler part fills an internal space of the second trench, and
the internal space is surrounded by the spacer part.

8. The three-dimensional semiconductor memory device of claim 7, wherein
the spacer part of the second separation structure includes at least one of silicon oxide, silicon nitride, or silicon oxynitride, and
the filler part of the second separation structure includes a semiconductor material or a metallic material.

9. The three-dimensional semiconductor memory device of claim 7, wherein
the spacer part of the second separation structure includes a first spacer and a second spacer,
the first spacer conformally covers the inner sidewall of the second trench and the bottom surface of the second trench,
the second spacer is on the first spacer, and
the first spacer and the second spacer include different materials from each other.

10. The three-dimensional semiconductor memory device of claim 9, wherein
the first spacer includes silicon oxide, and
the second spacer includes silicon nitride or silicon oxynitride.

11. The three-dimensional semiconductor memory device of claim 1, wherein
the second separation structure includes a first part and a second part,
the first part extends in the first direction,
the second part is connected to the first part, and
the second part extends in a second direction intersecting the first direction.

12. The three-dimensional semiconductor memory device of claim 1, further comprising:
a plurality of first vertical channel structures penetrating the stack structure and contacting the plurality of gate electrodes; and
a plurality of second vertical channel structures penetrating the mold structure, the plurality of second vertical channel structures contacting the substrate and the plurality of sacrificial layers.

13. The three-dimensional semiconductor memory device of claim 12, wherein the level of the top surface of the second separation structure is higher than levels of top surfaces of the plurality of first vertical channel structures and levels of top surfaces of the plurality of second vertical channel structures.

14. A three-dimensional semiconductor memory device, comprising:
a first substrate including a first region and a second region;
a peripheral circuit structure including a plurality of peripheral circuit transistors on the first substrate;
a second substrate on the peripheral circuit structure;
a stack structure including a plurality of interlayer dielectric layers and a plurality of gate electrodes that are alternately and repeatedly stacked on the second substrate, the stack structure having a stepwise structure on the second region;
a plurality of first vertical channel structures penetrating the stack structure, the plurality of first vertical channel structures contacting the second substrate and the plurality of gate electrodes;
a first mold structure adjacent to the stack structure on the first region, the first mold structure including a plurality of interlayer dielectric layers and a plurality of sacrificial layers that are alternately and repeatedly stacked on the second substrate;
a plurality of second vertical channel structures penetrating the first mold structure, the plurality of second vertical channel structures contacting the second substrate and the plurality of sacrificial layers;
a first separation structure crossing the stack structure and extending along a first direction from the first region toward the second region;

a second separation structure crossing the first mold structure and extending in the first direction on the first region;

a first contact plug penetrating the stepwise structure of the stack structure and connecting electrically to one of the plurality of gate electrodes;

a second contact plug penetrating the first mold structure and connecting electrically to one of the plurality of peripheral circuit transistors of the peripheral circuit structure;

a plurality of bit lines electrically connected to the plurality of first vertical channel structures; and a plurality of conductive lines electrically connected to the first contact plug and the second contact plug, wherein a level of a top surface of the first separation structure is higher than a level of a top surface of the second separation structure.

15. The three-dimensional semiconductor memory device of claim 14, further comprising:

a source structure between the second substrate and the stack structure, wherein each of the plurality of first vertical channel structures and the plurality of second vertical channel structures include a data storage pattern adjacent to the stack structure, a vertical semiconductor pattern conformally covering an inner sidewall of the data storage pattern, and a conductive pad on the vertical semiconductor pattern, and wherein the source structure is in contact with the vertical semiconductor pattern of each of the plurality of first vertical channel structures.

16. The three-dimensional semiconductor memory device of claim 14, wherein a level of a top surface of the first contact plug and a level of a top surface of the second contact plug are higher than the level of the top surface of the second separation structure.

17. The three-dimensional semiconductor memory device of claim 14, further comprising:

a dielectric layer covering the top surface of the second separation structure and contacting a portion of a sidewall of the first separation structure, wherein the dielectric layer includes a plurality of bridges that are spaced apart in the first direction from each other across a portion of the first separation structure.

18. The three-dimensional semiconductor memory device of claim 14, further comprising:

a second mold structure on the second region, the second mold structure including a plurality of interlayer dielectric layers and a plurality of sacrificial layers that are alternately and repeatedly stacked on the second substrate; and a third separation structure surrounding the second mold structure.

19. An electric system, comprising:

a three-dimensional semiconductor memory device; and a controller electrically connected to the three-dimensional semiconductor memory device and configured to control the three-dimensional semiconductor memory device, wherein the three-dimensional semiconductor memory device includes a substrate including a first region and a second region, a stack structure including a plurality of interlayer dielectric layers and a plurality of gate electrodes that are alternately and repeatedly stacked on the substrate, a mold structure adjacent to the stack structure on the first region, a first separation structure crossing the stack structure and extending along a first direction from the first region toward the second region, a second separation structure crossing the mold structure and extending in the first direction on the first region, a plurality of contact plugs penetrating the mold structure, and an input/output pad connected to one of the plurality of contact plugs, wherein the stack structure has a stepwise structure on the second region, wherein the mold structure includes a plurality of interlayer dielectric layers and a plurality of sacrificial layers that are alternately and repeatedly stacked on the substrate, wherein the controller is electrically connected through the input/output pad to the three-dimensional semiconductor memory device, and wherein a height in a vertical direction of the first separation structure is greater than a height in the vertical direction of the second separation structure.

20. The electric system of claim 19, wherein the three-dimensional semiconductor memory device further includes a peripheral circuit structure below the substrate, and wherein the input/output pad is electrically connected to the peripheral circuit structure through one of the plurality of contact plugs.

* * * * *